(12) United States Patent
Jung et al.

(10) Patent No.: US 12,201,042 B2
(45) Date of Patent: Jan. 14, 2025

(54) RESISTANCE RANDOM ACCESS MEMORY DEVICE AND METHOD FOR MANUFACTURING SAME

(71) Applicant: RESEARCH & BUSINESS FOUNDATION SUNGKYUNKWAN UNIVERSITY, Suwon-si (KR)

(72) Inventors: Hyun Suk Jung, Seoul (KR); SangMyeong Lee, Gimhae-si (KR); Won Bin Kim, Suwon-si (KR); Jae Myeong Lee, Jincheon-gun (KR); Oh Yeong Gong, Suwon-si (KR); Jun Young Kim, Suwon-si (KR); Jin Hyuk Choi, Suwon-si (KR); ChangHwun Sohn, Busan (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 446 days.

(21) Appl. No.: 17/527,648

(22) Filed: Nov. 16, 2021

(65) Prior Publication Data

US 2022/0158094 A1   May 19, 2022

(51) Int. Cl.
*H10N 70/00* (2023.01)
*H10B 63/00* (2023.01)

(52) U.S. Cl.
CPC ........ *H10N 70/8836* (2023.02); *H10B 63/20* (2023.02); *H10N 70/021* (2023.02); *H10N 70/8833* (2023.02); *H10N 70/841* (2023.02)

(58) Field of Classification Search
CPC ............................... H10N 70/00; H10B 63/00
See application file for complete search history.

(56) References Cited

U.S. PATENT DOCUMENTS

2020/0194669 A1* 6/2020 Jang .................... H10N 70/841

FOREIGN PATENT DOCUMENTS

KR    10-2019-0089784 A     7/2019

* cited by examiner

*Primary Examiner* — Marvin Payen
(74) *Attorney, Agent, or Firm* — NSIP Law

(57) ABSTRACT

A resistance random access memory device includes a resistance change layer, including an organometallic halide having perovskite grains, disposed on a first electrode; and a second electrode disposed on the resistance change layer. A boundary between the perovskite grains comprises an amorphous metal oxide.

20 Claims, 12 Drawing Sheets

FIG.7

| Materials | Cohesive Energy (eV) | Materials | Cohesive Energy (eV) |
|---|---|---|---|
| $MAPbI_3$ | -4.2557 | $WO_3$ | -7.5107 |
| $SiO_2$ | -7.9162 | $Mn_3O_4$ | -7.697 |
| $TiO_2$ | -8.9741 | $TcO_2$ | -8.1776 |
| $ZrO_2$ | -9.5035 | $ReO_3$ | -8.4422 |
| $Al_2O_3$ | -7.4814 | $Fe_2O_3$ | -6.7493 |
| $MgO$ | -5.9837 | $RuO_2$ | -7.3898 |
| $CaO$ | -6.439 | $OsO_4$ | -7.1826 |
| $SrO$ | -6.0523 | $CoO$ | -6.15 |
| $BaO$ | -5.9136 | $RhO_2$ | -6.5143 |
| $Sc_2O_3$ | -9.0583 | $IrO_2$ | -7.0477 |
| $Y_2O_3$ | -9.1141 | $NiO$ | -4.9681 |
| $HfO_2$ | -10.1795 | $CuO$ | -5.1229 |
| $V_2O_3$ | -8.036 | $ZnO$ | -4.5512 |
| $Nb_2O_5$ | -8.9638 | $Ga_2O_3$ | -6.0368 |
| $Ta_2O_5$ | -9.7724 | $In_2O_3$ | -5.6543 |
| $Cr_2O_3$ | -7.9848 | $GeO_2$ | -6.4587 |
| $MoO_2$ | -7.4056 | $SnO_2$ | -6.2846 |

(A)

(B)

(A) AlOₓ

(B) Grain Boundary

Grain Center

RESISTANCE RANDOM ACCESS MEMORY DEVICE AND METHOD FOR MANUFACTURING SAME

CROSS-REFERENCE TO RELATED APPLICATIONS

This application claims the benefit under 35 USC 119(a) of Korean Patent Application No. 10-2020-0152790 filed on Nov. 16, 2020, in the Korean Intellectual Property Office, the disclosure of which is incorporated herein by reference.

BACKGROUND

1. Field

The following description relates to a resistance random access memory device and a method for manufacturing the same.

2. Description of Related Art

Non-volatile memory is suitable for mobile devices such as mobile phones, etc. Since it has all the advantages of RAM, which allows input and output of information freely, as well as the advantages of ROM, in which input information is not erased even when power is not supplied. Such a non-volatile memory includes a resistance random access memory (RRAM), a magnetic random access memory (MRAM), a ferroelectric random access memory (FRAM), a phase-change random access memory (PRAM), etc. In particular, the resistance random access memory is one of the next-generation non-volatile memory devices having considerable competitiveness compared to the flash memory since it has characteristics such as low power, high speed, non-volatility, simple structure, etc.

The resistance random access memory device, which is attracting attention as a next-generation memory device due to its high density, high integration, and low power properties, has characteristics capable of recording information depending on the resistance state while increasing or decreasing the electrical resistance through an electrical signal. The resistance random access memory device uses a simple device structure (metal/oxide/metal), and when an appropriate voltage/current condition is applied, the resistance changes from a state where conduction with a large resistance does not occur to a state where conduction with a small resistance is possible. These two types of resistance states are distinguished by a difference between '0' and '1', and refer to a memory device that recognizes them. Depending on a method in which resistance is changed within a material, its detailed names are divided into a phase-change RAM (PRAM), which is an effect caused by the phase change, a magnetic RAM (MRAM) due to the change of spin, and a resistance RAM (RRAM) by the movement of ions within the material.

The resistance random access memory device has a structure in which upper and lower electrodes are disposed on a thin film, and a resistance change layer made of an oxide thin film is included between the upper and lower electrodes. The memory operation is implemented using a phenomenon in which the resistance state of the resistance change layer is changed depending on a voltage applied to the resistance change layer.

The resistance state of the resistance random access memory device is changed as a metal filament is formed and disappears by a redox reaction of metal atoms or metal ions penetrated into the resistance change layer from a metal electrode depending on a voltage applied to the resistance change layer. As a material for the resistance change layer that has been used up to date, a solid electrolyte material such as an oxide or GeS is mainly used. However, in the oxide-based solid electrolyte material, it has problems in that the HRS/LRS resistance and the distribution characteristics of the set/reset voltage are very unstable, and it is very difficult to be adjusted arbitrarily. Therefore, the development of a new resistance change layer material is desired in order to overcome these problems.

Korean Patent Laid-Open Publication No. 10-2019-0089784 is a patent related to a resistance random access memory device including a resistance change layer including a perovskite crystal structure and a method for manufacturing the same. However, unlike the present disclosure, it does not describe a method of passivating perovskite grains by a boundary between the grains in order to improve the durability and performance of the resistance change layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a resistance random access memory device includes a resistance change layer, including an organometallic halide having perovskite grains, disposed on a first electrode; and a second electrode disposed on the resistance change layer. A boundary between the perovskite grains comprises an amorphous metal oxide.

The halide ions may not pass between the grains due to a boundary between the grains.

The amorphous metal oxide may be one represented by Chemical Formula 1:

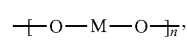
[Chemical Formula 1]

wherein M is Zr, Ti, Al, Si, Mg, Ca, Sr, Ba, Sc, Y, Hf, V, Nb, Ta, Cr, Mo, W, Mn, Tc, Re, Fe, Ru, Os, Co, Rh, Ir, Ni, C, Zn, Ga, In, Ge, or Sn, and n is 1 to 25.

The resistance random access memory device may further include a polymer protective layer disposed between the second electrode and the resistance change layer.

The polymer protective layer may include an ion conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly[2-methoxy ethyl glycidyl ether], and combinations thereof.

The organometallic halide may be one represented by Chemical Formula 2 or Chemical Formula 3:

 [Chemical Formula 2]

wherein R is a substituted or unsubstituted $C_1$-$C_{24}$ alkyl group, and when R is substituted, the substituent is an amino group, a hydroxyl group, a cyano group, a halogen group, a nitro group, or a methoxy group, M comprises a metal cation selected from the group consisting of Pb, Sn, Ge, Cu, Ni, Co, Fe, Mn, Cr, Pd, Cd, Yb, and combinations thereof, and X comprises a halide anion;

$$R_2MX_4, \quad \text{[Chemical Formula 3]}$$

wherein R is a substituted or unsubstituted $C_1$-$C_{24}$ alkyl group, and when R is substituted, the substituent is an amino group, a hydroxyl group, a cyano group, a halogen group, a nitro group, or a methoxy group, M comprises a metal cation selected from the group consisting of Pb, Sn, Ge, Cu, Ni, Co, Fe, Mn, Cr, Pd, Cd, Yb, and combinations thereof, and X comprises a halide anion.

Each of the first electrode and the second electrode may include a material selected from the group consisting of a metal, a conductive polymer, a carbon material, and combinations thereof.

The first electrode and the second electrode may include same or different electrode materials.

In another general aspect, a method for manufacturing a resistance random access memory device, includes forming a first electrode on a substrate; forming a resistance change layer, including an organometallic halide having a perovskite grain boundary, on the first electrode; and forming a second electrode on the resistance change layer.

The forming of the resistance change layer may include coating a solution in which a metal alkoxide and an organometallic halide having a perovskite crystal structure are dissolved in a solvent on the first electrode.

The metal alkoxide may be one represented Chemical Formula 4:

$$M\text{-}(OR')_m, \quad \text{[Chemical Formula 4]}$$

wherein M is Zr, Ti, Al, Si, Mg, Ca, Sr, Ba, Sc, Y, Hf, V, Nb, Ta, Cr, Mo, W, Mn, Tc, Re, Fe, Ru, Os, Co, Rh, Ir, Ni, C, Zn, Ga, In, Ge, or Sn, m is a valence of M, and R' is hydrogen, or a linear or branched $C_1$-$C_7$ alkyl group.

The solvent may be one selected from the group consisting of dimethylformamide, dimethylsulfoxide, dimethylacetamide, N-methylpyrrolidone, N-methyl-2-pyridine, pyridine, aniline, and combinations thereof.

The method may further include forming a polymer protective layer on the resistance change layer before forming the second electrode.

The organometallic halide having the perovskite crystal structure may be one represented by the following Chemical Formula 5 or Chemical Formula 6:

$$RMX_3, \quad \text{[Chemical Formula 5]}$$

wherein R is a substituted or unsubstituted $C_1$-$C_{24}$ alkyl group, and when R is substituted, the substituent is an amino group, a hydroxyl group, a cyano group, a halogen group, a nitro group, or a methoxy group, M comprises a metal cation selected from the group consisting of Pb, Sn, Ge, Cu, Ni, Co, Fe, Mn, Cr, Pd, Cd, Yb, and combinations thereof, and X comprises a halide anion;

$$R_2MX_4, \quad \text{[Chemical Formula 6]}$$

wherein R is a substituted or unsubstituted $C_1$-$C_{24}$ alkyl group, and when R is substituted, the substituent is an amino group, a hydroxyl group, a cyano group, a halogen group, a nitro group, or a methoxy group, M comprises a metal cation selected from the group consisting of Pb, Sn, Ge, Cu, Ni, Co, Fe, Mn, Cr, Pd, Cd, Yb, and combinations thereof, and X comprises a halide anion.

A memristor may include the resistance random access memory device.

Other features and aspects will be apparent from the following detailed description, the drawings, and the claims.

Figure 3:
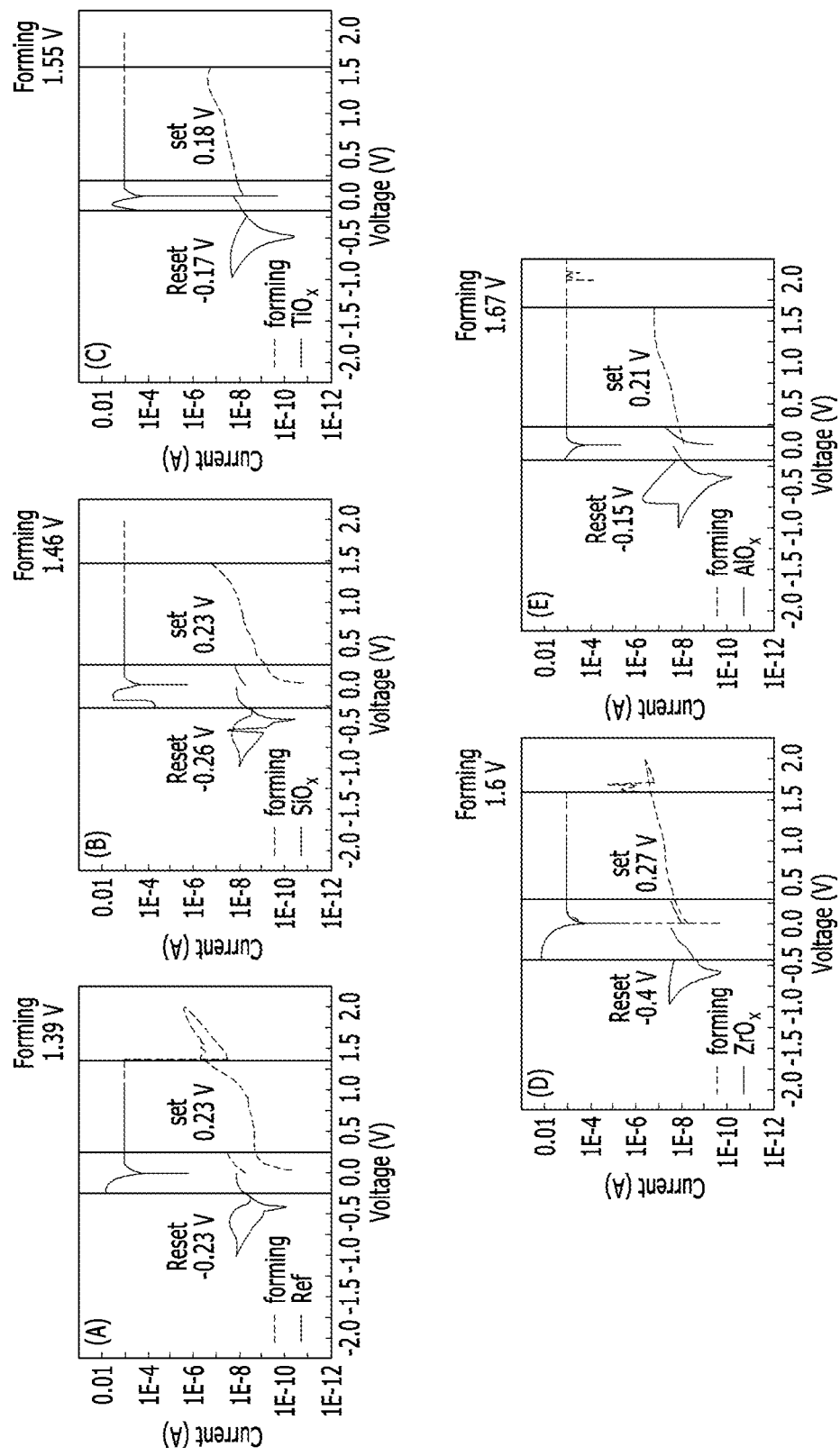

(A) of FIG. 3 is a graph measuring the relationship between voltage and current of a resistance random access memory device according to a comparative example of the present application, and (B), (C), (D), and (E) of FIG. 3 are graphs measuring the relationship between voltage and current depending on the types of an amorphous metal oxide of a resistance random access memory device according to an example of the present application.

Figure 4:
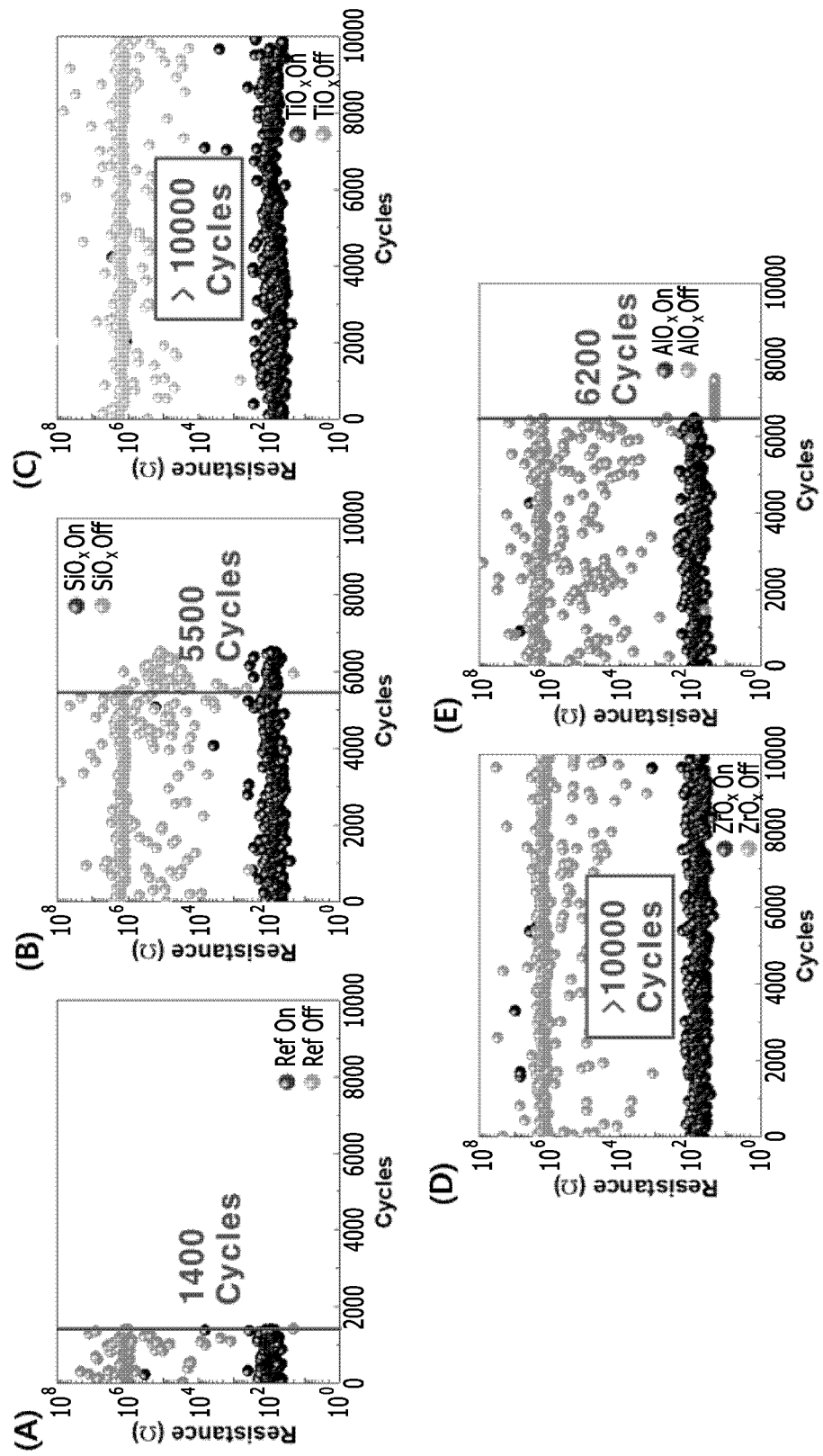

(A) of FIG. 4 is a graph measuring the durability of a resistance random access memory device according to a comparative example of the present application, and (B), (C), (D), and (E) of FIG. 4 are graphs measuring the durability depending on the types of an amorphous metal oxide contained in a resistance random access memory device according to an example of the present application.

Figure 5:
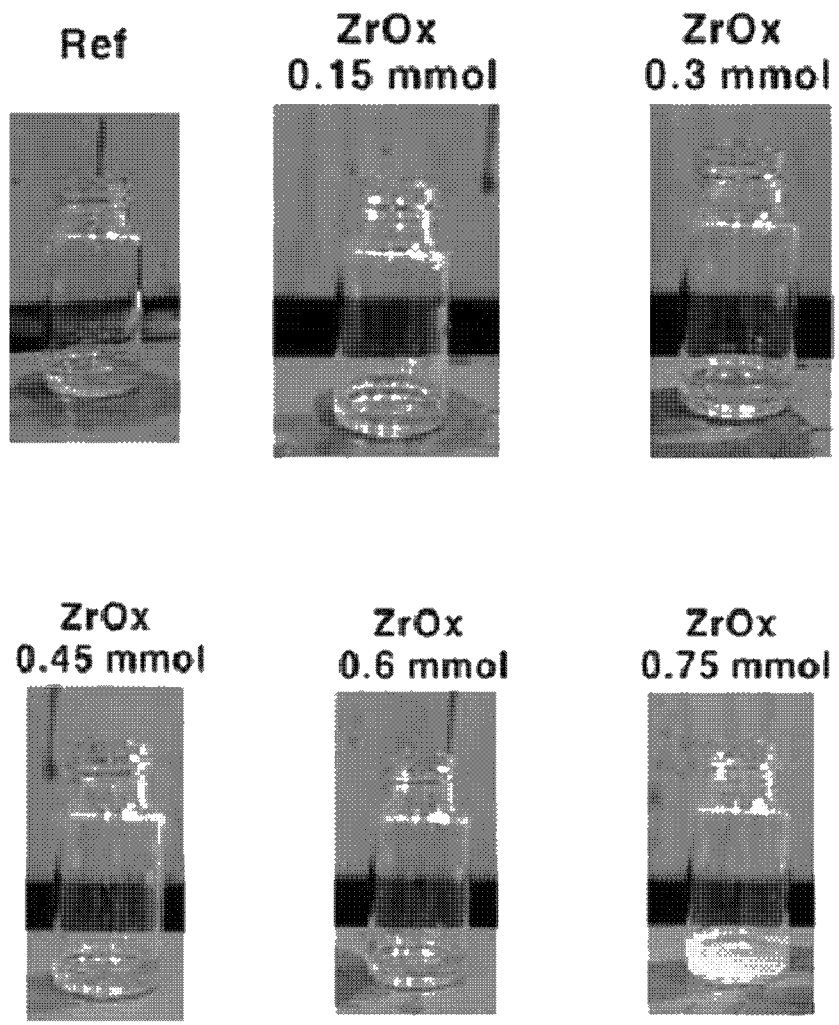

FIG. 5 depicts photographs showing changes in a solvent due to the hydrolysis reaction of a perovskite grain precursor depending on the concentrations of metal alkoxides according to a comparative example and an example of the present application.

Figure 6:
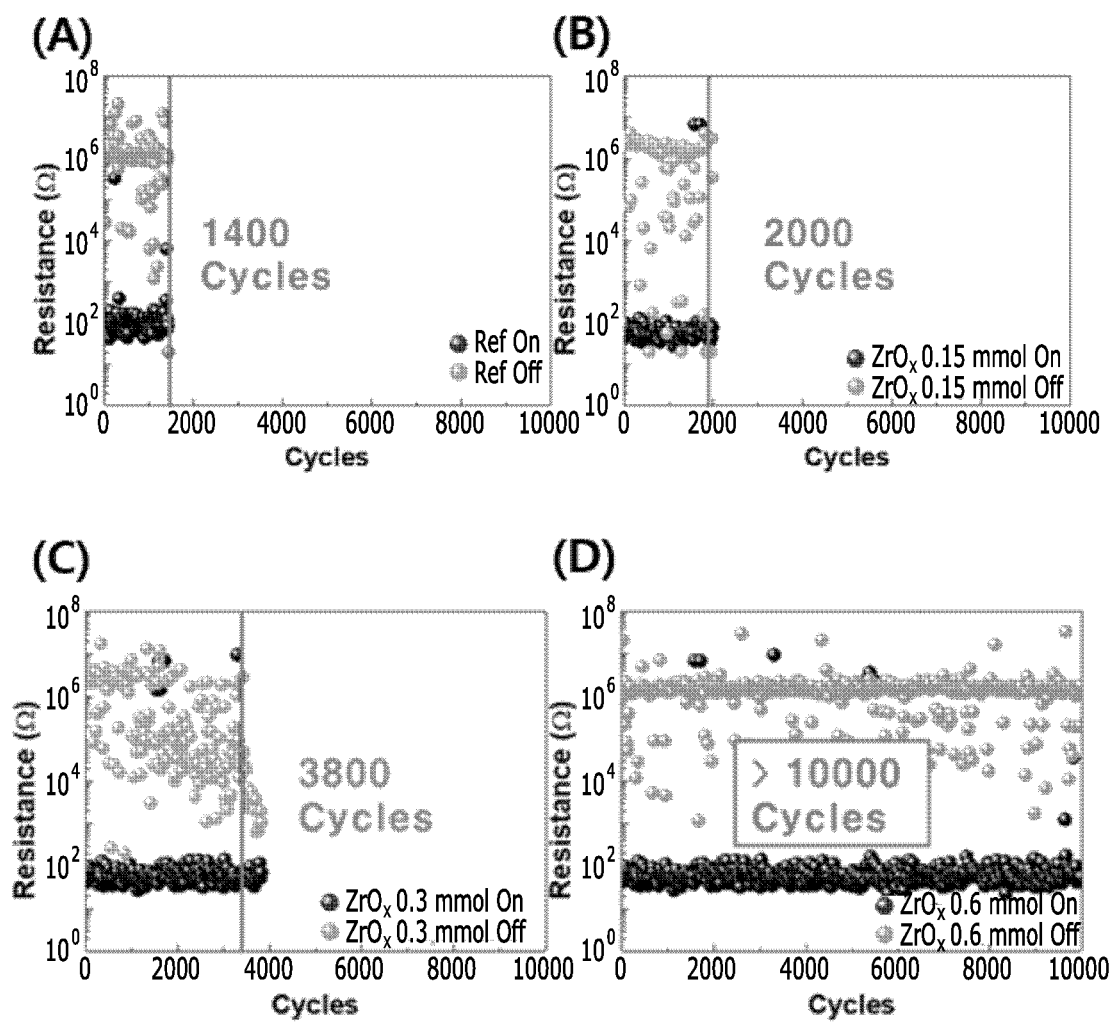

(A) of FIG. 6 is a graph measuring the durability of a resistance random access memory device according to a comparative example of the present application, and (B), (C), and (D) of FIG. 6 are graphs measuring the durability depending on the concentrations of zirconium ethoxide of a resistance random access memory device according to an example of the present application.

FIG. 7 is a table showing cohesive energies of a perovskite crystal structure and oxides according to an example and a comparative example of the present application.

Figure 8:
Figure 8:
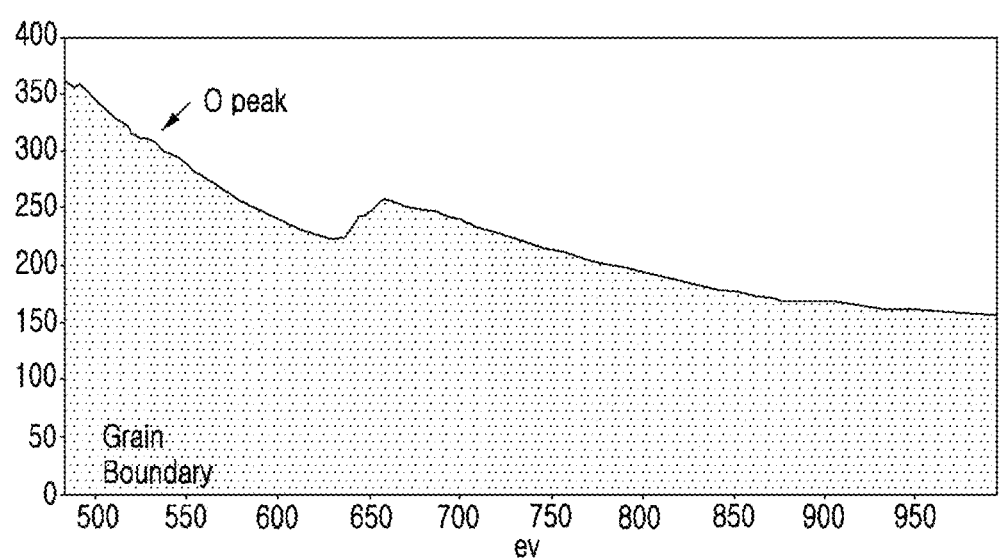
Figure 8:
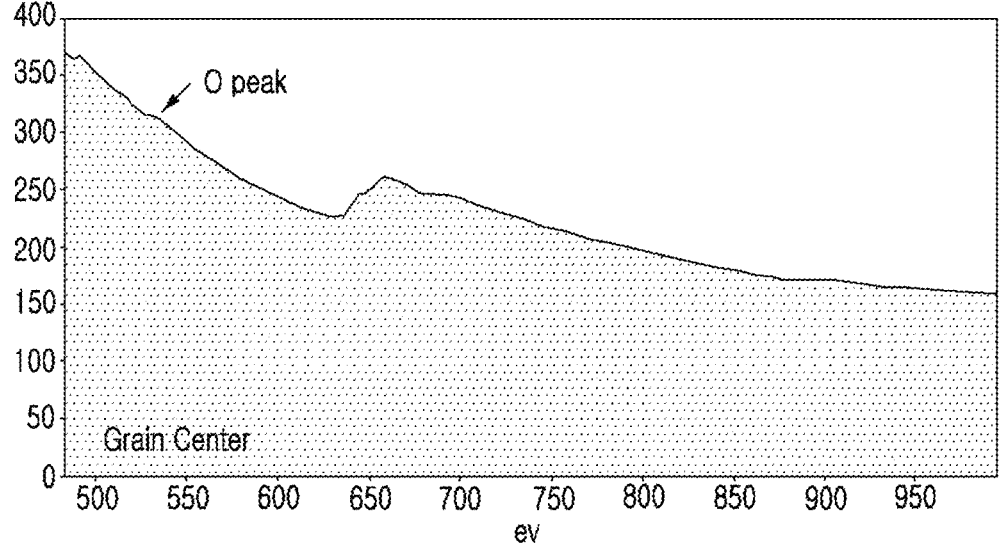

(A) of FIG. 8 is an actual image of a perovskite material in which an amorphous metal oxide is not contained in the perovskite grain boundary according to a comparative example of the present application, and (B) of FIG. 8 is electron energy loss spectroscopy (EELS) data of the perovskite material.

Figure 9:
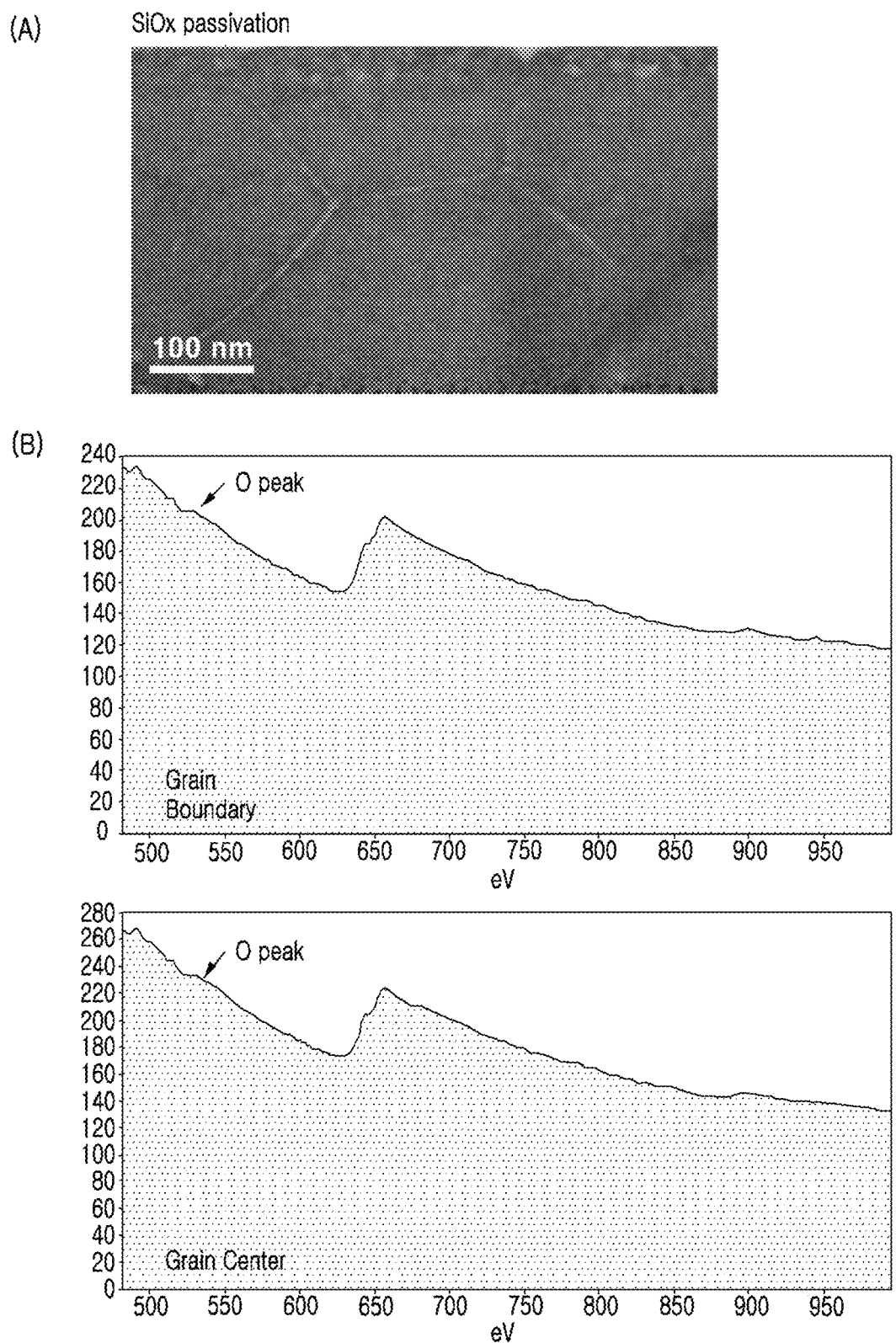

(A) of FIG. 9 is an actual image of a perovskite material in which $SiO_x$ is formed as an amorphous metal oxide in the perovskite grain boundary according to an example of the present application, and (B) of FIG. 9 is electron energy loss spectroscopy (EELS) data of the perovskite material.

Figure 10:
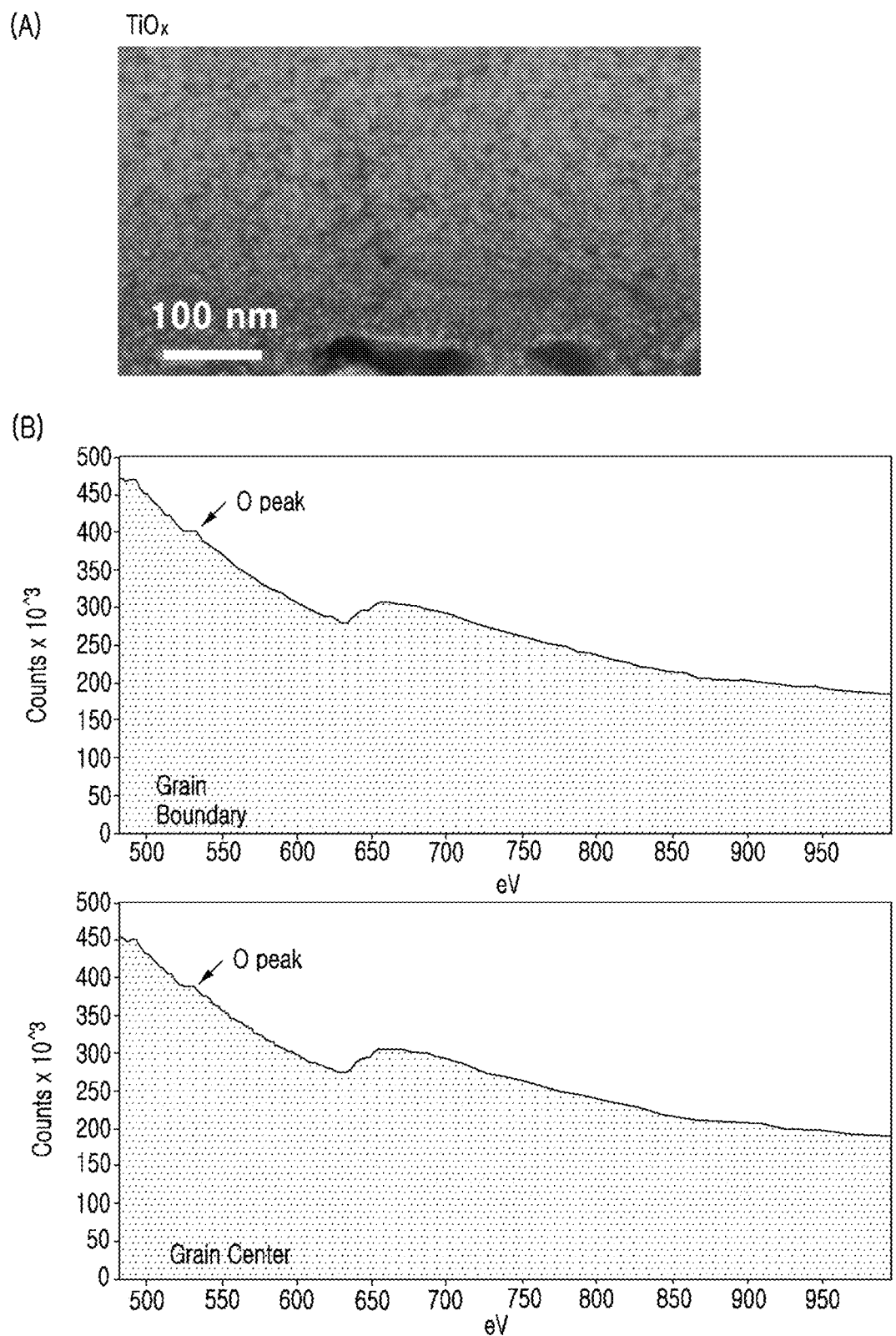

(A) of FIG. 10 is an actual image of a perovskite material in which $TiO_x$ is formed as an amorphous metal oxide in the perovskite grain boundary according to an example of the present application, and (B) of FIG. 10 is electron energy loss spectroscopy (EELS) data of the perovskite material.

Figure 11:
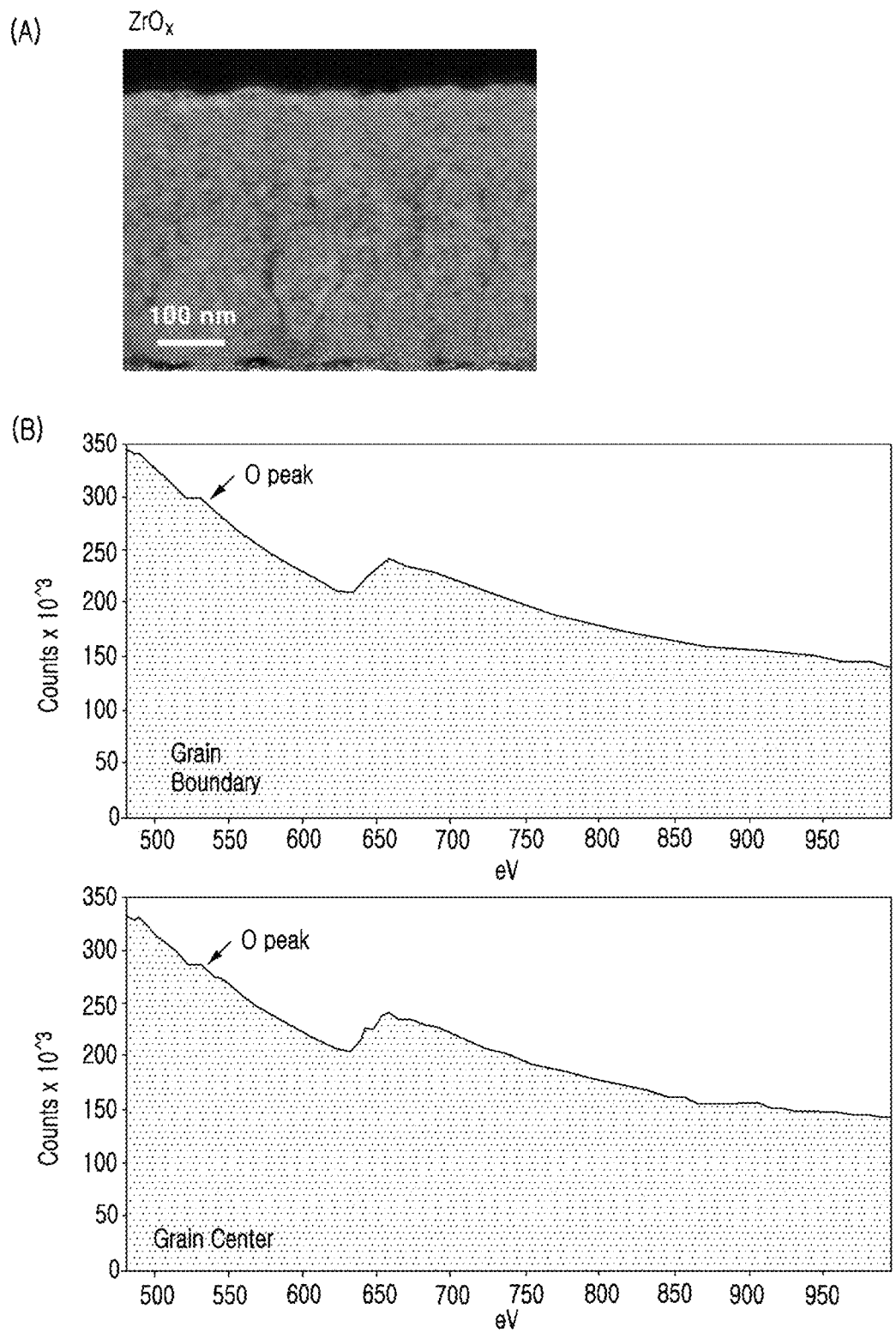

(A) of FIG. 11 is an actual image of a perovskite material in which $ZrO_x$ is formed as an amorphous metal oxide in the perovskite grain boundary according to an example of the present application, and (B) of FIG. 11 is electron energy loss spectroscopy (EELS) data of the perovskite material.

Figure 12:
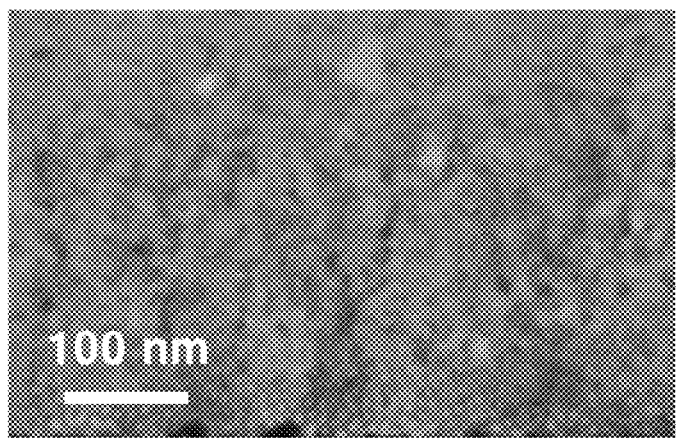
Figure 12:
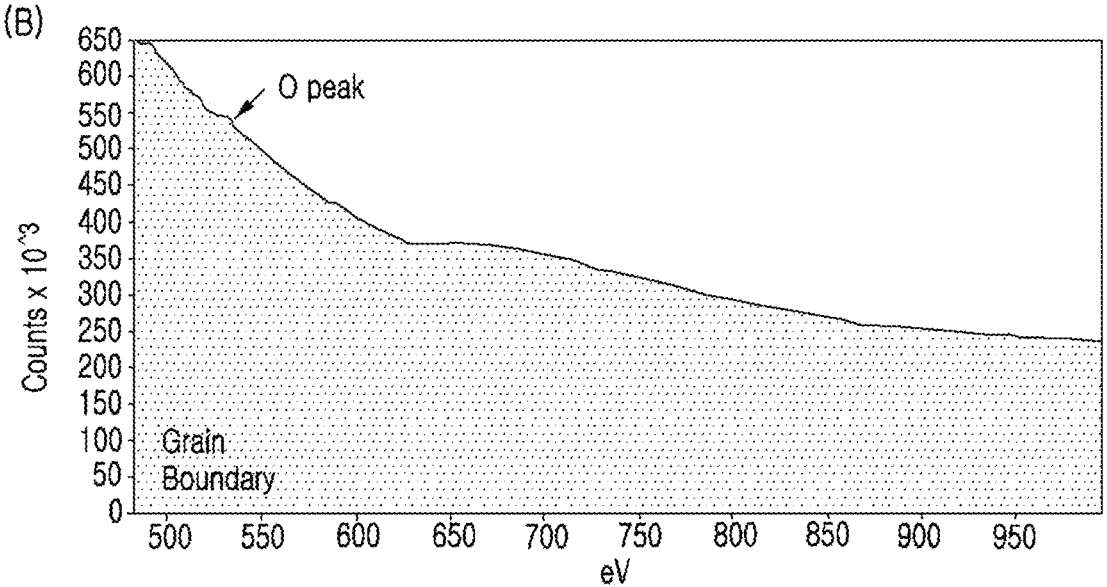
Figure 12:
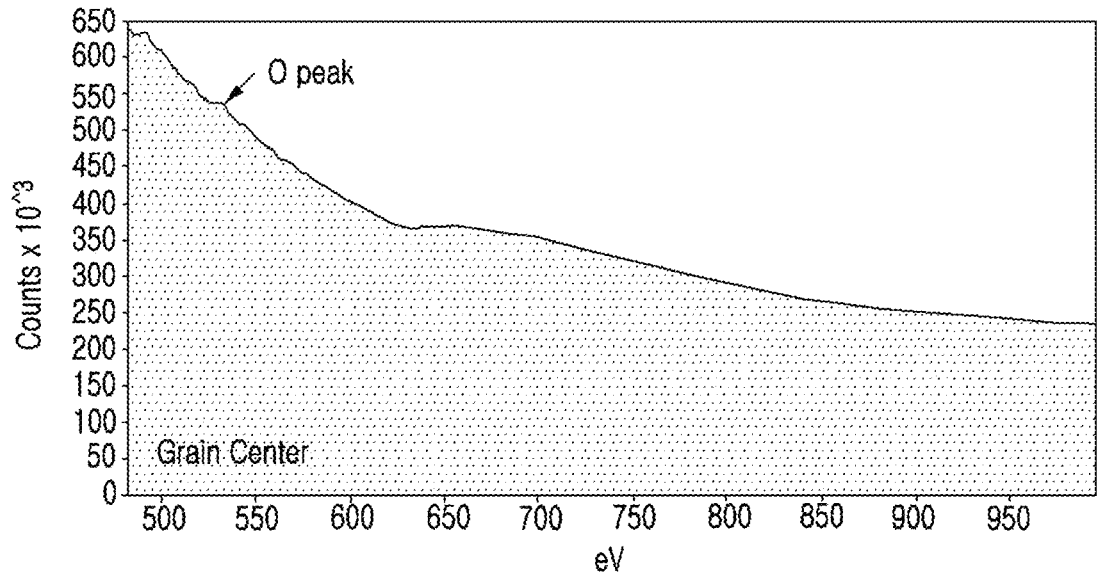

(A) of FIG. 12 is an actual image of a perovskite material in which $AlO_x$ is formed as an amorphous metal oxide in the perovskite grain boundary according to an example of the present application, and (B) of FIG. 12 is electron energy loss spectroscopy (EELS) data of the perovskite material.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

When unique manufacture and material allowable errors of numerical values are suggested to mentioned meanings of terms of degrees used in the present specification such as "about", "substantially", etc., the terms of degrees are used in the numerical values or as a meaning near the numerical values, and the terms of degrees are used to prevent that an unscrupulous infringer unfairly uses a disclosure content in which exact or absolute numerical values are mentioned to help understanding of the present application. Further, in the whole specification of the present application, "a step to do ~" or "a step of ~" does not mean "a step for ~".

In the whole specification of the present application, a term of "a combination thereof" included in a Markush type expression, which means a mixture or combination of one or more selected from the group consisting of elements described in the Markush type expression, and means including one or more selected from the group consisting of the elements.

Hereinafter, a resistance random access memory device of the present application, a method for manufacturing the same, and a memristor including the resistance random access memory device will be described in detail with reference to embodiments, examples, and drawings. However, the present application is not limited to such embodiments, examples, and drawings.

The present application is to solve the problems of the conventional art described above. An object of the present application is to provide a resistance random access memory device that passivates the perovskite grains by allowing a boundary between the grains to be formed of amorphous metal oxide in a resistance change layer containing an organometallic halide having perovskite grains.

Further, another object of the present application is to provide a method for manufacturing the resistance random access memory device.

Further, another object of the present application is to provide a memristor, including the resistance random access memory device.

The resistance random access memory device of the present application contains an amorphous metal compound in a resistance change layer having an existing perovskite structure, and the amorphous metal compound forms a boundary between perovskite grains.

Due to this, the resistance random access memory device of the present application may secure better repetitive driving characteristics and data retention ability than an existing resistance random access memory device by not allowing halide ions of a perovskite material to pass between the grains to control the growth of a filament of the resistance change layer and reducing the reactivity with the electrode to prevent the decomposition of the perovskite grains.

As a technical means for achieving the above-mentioned technical tasks, the first aspect of the present application provides a resistance random access memory device including: a resistance change layer containing an organometallic halide having perovskite grains, formed on a first electrode; and a second electrode formed on the resistance change layer, in which a boundary between the grains contains an amorphous metal oxide.

Looking at the cross-section of a metal or alloy, it is recognized that it is made up of countless fine particles. These are called grains. Crystallographically speaking, it is an aggregate of crystal lattices grown from one crystal nucleus, and those grown from another nucleus become other grains. Since the grain is huge compared to the crystal lattice, and the axial direction of growing individually is different, it can be identified under a microscope due to the fact that the reflection situation of the rays is different. The metal structure is a bond of these grains, and this is a reason why the shape, size, and bonding method of the grains are important as they are connected with the properties of their material.

When the molten metal solidifies and crystals grow, if adjacent crystal growth planes come into contact with each other, a boundary surface is formed in that place. The intersection line between the boundary surface and the plane of a specimen is called a boundary line of the crystal, a grain boundary. Since the vicinity of the boundary surface is a finally solidified part, a eutectic, impurities, etc., with a low melting point are gathered. Therefore, when viewed under a microscope, grain boundaries are more susceptible to corrosion than other parts and appear as black lines.

According to the present application, the resistance change layer of the resistance random access memory device contains an organometallic halide with perovskite grains.

A boundary between the perovskite grains, a grain boundary, is formed of an amorphous metal oxide, and halide ions on the perovskite material cannot pass between the perovskite grains by the metal oxide formed at the grain boundary.

The resistance random access memory device, according to the present application, forms an amorphous metal oxide in a perovskite grain boundary to suppress the ion movement characteristics and the reactivity with an upper electrode material of the resistance random access memory device formed of the perovskite material, and allows the perovskite grains to be passivated by the perovskite grain boundary containing the amorphous metal oxide so that halide ions of the perovskite cannot pass between the grains.

Through this, it is possible to reduce the reactivity of the upper electrode material and the resistance change layer, and the growth of the filament is controlled. The decomposition of the perovskite is prevented to ensure excellent repetitive driving characteristics and data retention ability, thereby enabling a high-performance perovskite resistance random access memory device to be manufactured.

According to an embodiment of the present application, the resistance random access memory device may further include a polymer protective layer formed on the resistance change layer, but the present application is not limited thereto.

Figure 1:
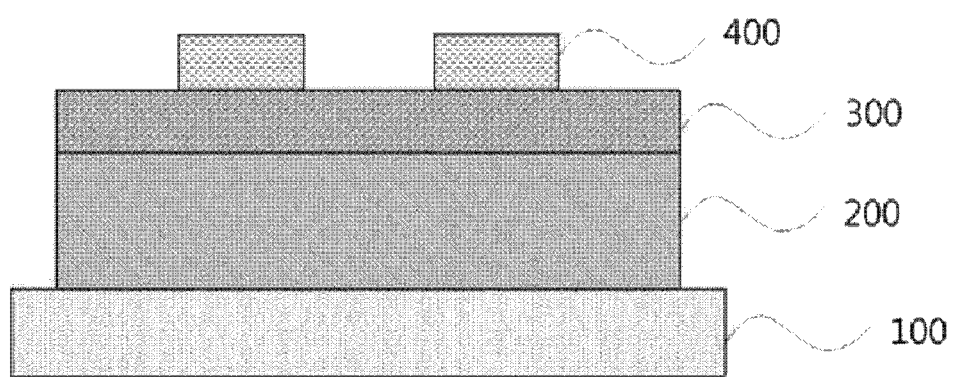
FIG. 1 is a cross-sectional view of a resistance random access memory device according to an embodiment of the present application.

FIG. 1 is a cross-sectional view of a resistance random access memory device according to an embodiment of the present application.

Specifically, a resistance random access memory device according to an embodiment of the present application may include a first electrode 100, a resistance change layer 200 containing an organometallic halide having perovskite grains formed on the first electrode 100, a polymer protective layer 300 formed on the resistance change layer 200, and a second electrode 400 formed on the polymer protective layer 300, but the present application is not limited thereto.

According to an embodiment of the present application, the first electrode 100 and the second electrode 400 may each independently include a material selected from the group consisting of a metal, a conductive polymer, a carbon material, and combinations thereof, but the present application is not limited thereto.

According to an embodiment of the present application, the first electrode 100 and the second electrode 400 may include electrode materials that are the same as or different from each other, but the present application is not limited thereto.

The metal may include a metal selected from the group consisting of Pt, Ti, Ag, Cu, Ni, Sc, V, Cr, Mn, Fe, Co, Zn, Y, Zr, Nb, Mo, Tc, Ru, Rh, Pd, Cd, Hf, Ta, W, Re, Os, Ir, Au, Hg, Rf, Db, Sg, Bh, Hs, Mt, Ds, Rg, Cn, and combinations thereof, but the present application is not limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but the present application is not limited thereto.

The carbon material may include a carbon material selected from the group consisting of carbon nanotubes, graphene, fullerene, carbon nanofibers, and combinations thereof, but the present application is not limited thereto.

According to an embodiment of the present application, the amorphous metal oxide may be one represented by the following Chemical Formula 1, but the present application is not limited thereto:

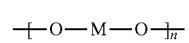

[Chemical Formula 1]

(In the formula, M is Zr, Ti, Al, Si, Mg, Ca, Sr, Ba, Sc, Y, Hf, V, Nb, Ta, Cr, Mo, W, Mn, Tc, Re, Fe, Ru, Os, Co, Rh, Ir, Ni, C, Zn, Ga, In, Ge, or Sn, and n is 1 to 25).

According to an embodiment of the present application, halide ions may not pass between the grains due to a boundary between the grains, but the present application is not limited thereto.

In the case of an existing perovskite-based resistance random access memory device, a perovskite resistance change layer is formed by spin-coating a precursor obtained by dissolving an organic halide compound and a metal halide compound in a polar aprotic solvent. In the case of a perovskite resistance random access memory device formed by such a method, ions move freely due to the ion movement characteristics of the perovskite. Due to this, it becomes difficult to control the growth of the filament so that the repetitive driving durability and the data retention ability become insufficient.

Further, the decomposition of the perovskite is accelerated by the reactivity of the upper electrode material and the perovskite so that it is transformed into a non-uniform thin film, resulting in insufficient repetitive driving durability and data retention ability.

The resistance random access memory device, according to the present application, forms an amorphous metal oxide in the perovskite grain boundary to suppress the ion movement characteristics and the reactivity with the upper electrode material of the resistance random access memory device formed of the perovskite material, and allows the perovskite grains to be passivated by the perovskite grain boundary containing the amorphous metal oxide so that halide ions of the perovskite cannot pass between the grains.

Through this, a high-performance perovskite resistance random access memory device can be manufactured by reducing the reactivity of the upper electrode material and the resistance change layer to control the growth of the filament and preventing the decomposition of the perovskite to ensure excellent repetitive driving characteristics and data retention ability.

According to an embodiment of the present application, the organometallic halide having the perovskite grains may be one represented by the following Chemical Formula 2 or Chemical Formula 3, but the present application is not limited thereto:

$$RMX_3 \quad \text{[Chemical Formula 2]}$$

(R is a substituted or unsubstituted $C_1$-$C_{24}$ alkyl group, and when R is substituted, the substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion);

$$R_2MX_4 \quad \text{[Chemical Formula 3]}$$

(R is a substituted or unsubstituted $C_1$-$C_{24}$ alkyl group, and when R is substituted, the substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion).

The perovskite grains represented by Chemical Formula 2 above may have a three-dimensional crystal structure, but the present application is not limited thereto.

In an embodiment of the present application, R is a monovalent organic ammonium ion represented by $(R^1R^2R^3R^4N)^+$ in Chemical Formula 2 above, in which $R^1$ to $R^4$ may each independently include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R is a monovalent organic ammonium ion represented by $(R^5—NH_3)^+$ in Chemical Formula 2 above, in which $R^5$ may include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R may be one represented by Chemical Formula $(R^6R^7N=CH—NR^8R^9)^+$ in Chemical Formula 2 above, in which $R^6$ may be hydrogen, an unsubstituted or substituted alkyl group having 1 to 20 carbon atoms, or an unsubstituted or substituted aryl group, $R^7$ may be hydrogen, an unsubstituted or substituted alkyl group having 1 to 20 carbon atoms, or an unsubstituted or substituted aryl group, $R^8$ may be hydrogen, an unsubstituted or substituted alkyl group having 1 to 20 carbon atoms, or an unsubstituted or substituted aryl group, and $R^9$ may be hydrogen, an unsubstituted or substituted alkyl group having 1 to 20 carbon atoms, or an unsubstituted or substituted aryl group, but the present application is not limited thereto.

An alkyl group used in the present application may be a substituted or unsubstituted, linear or branched chain saturated radical, which may often be a substituted or unsubstituted linear chain saturated radical, e.g., an unsubstituted linear chain saturated radical, but the present application is not limited thereto. For example, an alkyl group having 1 to 20 carbon atoms used in the present application may be a substituted or unsubstituted, linear or branched chain saturated hydrocarbon radical, but the present application is not limited thereto.

When the alkyl group is substituted, the substituent may be one or more substituents selected from the following, but the present application is not limited thereto. It may include a substituted or unsubstituted alkyl group having 1 to 20 carbon atoms, a substituted or unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfonic group (i.e., thiol, —SH), an alkylthio group having 1 to 10 carbon atoms, an arylthio group, a sulfonyl group, a phosphoric acid group, a phosphate ester group, a phosphonic acid group, and a phosphonate ester group, but the present application is not limited thereto. For example, the substituted alkyl group may include a halogenalkyl group, a hydroxyalkyl group, an aminoalkyl group, an alkoxyalkyl group, or an alkaryl group, but the present application is not limited thereto. The alkaryl group belongs to a substituted alkyl group having 1 to 20 carbon atoms, and refers to a case in which at least one hydrogen atom is substituted with an aryl group. For example, the aryl group substituting at least one hydrogen atom may include a benzyl group (phenylmethyl, PhCH$_2$—), a benzhydryl group (Ph$_2$CH—), a trityl group (triphenylmethyl, Ph$_3$C—), a phenylethyl group (Ph-CH$_2$CH$_2$—), a styryl group (PhCH=CH—), or a cinnamyl group (PhCH=CHCH$_2$—), but the present application is not limited thereto.

For example, $R^1$ to $R^9$ may each independently be an alkyl group, such an alkyl group represents a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms, and when the alkyl group is substituted with an alkyl group, it is also used interchangeably as a "branched alkyl group". A substituent that may be substituted for the alkyl group may include at least one selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxycarbonyl (—C(O)—O—R), alkylcarbonyloxy (—O—C(O)—R), amino (—$NH_2$), carbamoyl (—C(O)—NHR), urea (—NH—C(O)—NHR—), and thiol (—SH), but the present application is not limited thereto. In addition, the alkyl group having 2 or more carbon atoms among the above-described alkyl groups may include at least one carbon-to-carbon double bond or at least one carbon-to-carbon triple bond, but the present application is not limited thereto. For example, it may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanol, or all possible isomers thereof, but the present application is not limited thereto. For example, $R^1$ to $R^4$ and $R^5$ may each be, or alkyl groups that may be substituted therefor may each independently be an alkyl group having 1 to 10 carbon atoms, that is, a methyl group, an ethyl group, a propyl group, a butyl group, a pentyl group, a hexyl group, a heptyl group, an octyl group, a nonyl group, or a decyl group, or an alkyl group having 1 to 6 carbon atoms, that is, a methyl group, an ethyl group, a propyl group, a butyl group, a pentyl group, or a hexyl group, or an alkyl group having 1 to 4 carbon atoms, that is, a methyl group, an ethyl group, an i-propyl group, an n-propyl group, a t-butyl group, an s-butyl group, or an n-butyl group, but the present application is not limited thereto.

For example, when the alkyl group is substituted, the number of substituents substituting the alkyl group may be 1, 2, or 3, but the present application is not limited thereto. The aryl group among the substituents described independently for each of $R^1$ to $R^9$ is a substituted or unsubstituted single-ring or double-ring aromatic group, and this group may contain 6 to 14 carbon atoms, preferably 6 to 10 carbon atoms in the aromatic ring portion. For example, the aryl group used in the present application may include a phenyl group, a naphthyl group, an indenyl group, and an indanyl group, but the present application is not limited thereto. The aryl group may be substituted or unsubstituted, and when the aryl group as defined above is substituted, the substituent may be one or more substituents selected from the following, but the present application is not limited thereto. It may include an unsubstituted alkyl group having 1 to 6 carbon atoms (forming an aralkyl group), an unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphoric acid group, a phosphate ester group, a phosphonic acid group, and a sulfonyl group, but the present application is not limited thereto. For example, the substituted aryl group may have 1, 2, or 3 substituents, but the present application is not limited thereto. For example, the substituted aryl group may be substituted at two positions together with a single alkylene group having 1 to 6 carbon atoms or together with two ligand groups represented by Chemical Formula [—X—($C_1$-$C_6$)alkylene] or Chemical Formula [—X—($C_1$-$C_6$)alkylene-X—], in which X may be selected from O, S, and NR, and R may be H, an aryl group, or an alkyl group having 1 to 6 carbon atoms. For example, the substituted aryl group may be an aryl group fused with a cycloalkyl group or a heterocycloalkyl group. For example, the cyclic atoms of an aryl group may include one or more heteroatoms as a heteroaryl group. Such an aryl group or heteroaryl group is a substituted or unsubstituted single or double heterocyclic aromatic group, in which the aromatic group may contain 6 to 10 atoms in a cyclic portion containing one or more heteroatoms. For example, as a 5- or 6-parted ring, it may contain at least one heteroatom selected from O, S, N, P, Se, and Si. For example, 1, 2, or 3 heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but the present application is limited thereto. For example, the heteroaryl group may be unsubstituted, may be substituted as previously described for the aryl group, and when substituted, the number of the substituents may be, for example, 1, 2, or 3, but the present application is not limited thereto.

In an embodiment of the present application, R in Chemical Formula 2 above may include an alkali metal cation in addition to the organic cation, a mixed cation of the organic cation and the alkali metal cation, but the present application is not limited thereto. In this case, the alkali metal cation among the total cations of R in Chemical Formula 2 above may have a molar ratio of more than 0 to 0.2, but the present application is not limited thereto. The alkali metal cation may include a cation of a metal selected from the group consisting of Cs, K, Rb, Mg, Ca, Sr, Ba, and combinations thereof, but the present application is not limited thereto.

In an embodiment of the present application, X in Chemical Formula 2 above may include a halide anion, but the present application is not limited thereto. For example, X in Chemical Formula 2 above is a monovalent halide anion, and may include one or more anions selected from the group consisting of $F^-$, $Cl^-$, $Br^-$, $I^-$, and combinations thereof, but the present application is not limited thereto.

In an embodiment of the present application, the organometallic halide of Chemical Formula 2 above may be one or more selected from $CH_3NH_3PbI_xCl_y$ (a real number of 0≤x≤3, a real number of 0≤y≤3, and x+y=3), $CH_3NH_3PbI_xBr_y$ (a real number of 0≤x≤3, a real number of 0≤y≤3, and x+y=3), $CH_3NH_3PbCl_xBr_y$ (a real number of 0≤x≤3, a real number of 0≤y≤3, and x+y=3), and $CH_3NH_3PbI_xF_y$ (a real number of 0≤x≤3, a real number of 0≤y≤3, and x+y=3), and may further be one or more selected from $(CH_3NH_3)_2PbI_xCl_y$ (a real number of 0≤x≤4, a real number of 0≤y≤4, and x+y=4), $(CH_3NH_3)_2PbI_xBr_y$ (a real number of 0≤x≤4, a real number of 0≤y≤4, and x+y=4), $(CH_3NH_3)_2PbCl_xBr_y$ (a real number of 0≤x≤4, a real number of 0≤y≤4, and x+y=4), and $(CH_3NH_3)_2PbI_xF_y$ (a real number of 0≤x≤4, a real number of 0≤y≤4, and x+y=4), but the present application is not limited thereto.

In an embodiment of the present application, the organometallic halide of Chemical Formula 2 above may be one or more selected from $CH_3NH_3PbI_3$ (hereinafter also referred to as $MAPbI_3$), $CH_3NH_3PbBr_3$ (hereinafter also referred to as $MAPbBr_3$), $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$, but the present application is not limited thereto.

For example, the organometallic halide of Chemical Formula 2 above may be one or more selected from $CH_3CH_2NH_3PbI_3$, $CH_3CH_2NH_3PbBr_3$, $CH_3CH_2NH_3PbCl_3$, $CH_3CH_2NH_3PbF_3$, $CH_3CH_2NH_3PbBrI_2$, $CH_3CH_2NH_3PbBrCl_2$, $CH_3CH_2NH_3PbIBr_2$, $CH_3CH_2NH_3PbICl_2$, $CH_3CH_2NH_3PbClBr_2$, $CH_3CH_2NH_3PbI_2Cl$, $CH_3CH_2NH_3SnBrI_2$, $CH_3CH_2NH_3SnBrCl_2$, $CH_3CH_2NH_3SnF_2Br$, $CH_3CH_2NH_3SnIBr_2$, $CH_3CH_2NH_3SnICl_2$, $CH_3CH_2NH_3SnF_2I$, $CH_3CH_2NH_3SnClBr_2$, $CH_3CH_2NH_3SnI_2Cl$, and $CH_3NH_3SnF_2Cl$, but the present application is not limited thereto.

For example, the organometallic halide of Chemical Formula 2 above may be one or more selected from $CH_3(CH_2)_2NH_3PbI_3$, $CH_3(CH_2)_2NH_3PbBr_3$, $CH_3(CH_2)_2NH_3PbCl_3$, $CH_3(CH_2)_2NH_3PbF_3$, $CH_3(CH_2)_2NH_3PbBrI_2$, $CH_3(CH_2)_2NH_3PbBrCl_2$, $CH_3(CH_2)_2NH_3PbIBr_2$, $CH_3(CH_2)_2NH_3PbICl_2$, $CH_3(CH_2)_2NH_3PbClBr_2$, $CH_3(CH_2)_2NH_3PbI_2Cl$, $CH_3(CH_2)_2NH_3SnF_2Br$, $CH_3(CH_2)_2NH_3SnICl_2$, $CH_3(CH_2)_2NH_3SnF_2I$, $CH_3(CH_2)_2NH_3SnI_2Cl$, and $CH_3(CH_2)_2NH_3SnF_2Cl$, but the present application is not limited thereto.

For example, the organometallic halide of Chemical Formula 2 above may be one or more selected from $CH_3(CH_2)_3NH_3PbI_3$, $CH_3(CH_2)_3NH_3PbBr_3$, $CH_3(CH_2)_3NH_3PbCl_3$, $CH_3(CH_2)_3NH_3PbF_3$, $CH_3(CH_2)_3PbBrI_2$, $CH_3(CH_2)_3NH_3PbBrCl_2$, $CH_3(CH_2)_3NH_3PbIBr_2$, $CH_3(CH_2)_3NH_3PbICl_2$, $CH_3(CH_2)_3NH_3PbClBr_2$, $CH_3(CH_2)_3NH_3PbI_2Cl$, $CH_3(CH_2)_3NH_3SnF_2Br$, $CH_3(CH_2)_3NH_3SnF_2I$, and $CH_3(CH_2)_3NH_3SnF—Cl$, but the present application is not limited thereto.

For example, an organometallic halide having a three-dimensional perovskite crystal structure according to an embodiment of the present application may include $CH_3NH_3PbI_3$.

The perovskite grains represented by Chemical Formula 3 above may have a two-dimensional crystal structure, but the present application is not limited thereto.

In an embodiment of the present application, R is a monovalent organic ammonium ion represented by $(R^1R^2R^3R^4N)^+$ in Chemical Formula 3 above, in which $R^1$ to $R^4$ may each independently include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R is a monovalent organic ammonium ion represented by $(R^5—NH_3)^+$ in Chemical Formula 3 above, in which $R^5$ may include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R may be represented by Chemical Formula $(R^6R^7N=CH—NR^8R^9)^+$ in Chemical Formula 3 above, in which $R^6$ may be hydrogen, an unsubstituted or substituted alkyl group having 1 to 20 carbon atoms, or an unsubstituted or substituted aryl group, $R^7$ may be hydrogen, an unsubstituted or substituted alkyl group having 1 to 20 carbon atoms, or an unsubstituted or substituted aryl group, $R^8$ may be hydrogen, an unsubstituted or substituted alkyl group having 1 to 20 carbon atoms, or an unsubstituted or substituted aryl group, and $R^9$ may be hydrogen, an unsubstituted or substituted alkyl group having 1 to 20 carbon atoms, or an unsubstituted or substituted aryl group, but the present application is not limited thereto.

An alkyl group used in the present application may be a substituted or unsubstituted, linear or branched chain saturated radical, which may often be a substituted or unsubstituted linear chain saturated radical, e.g., an unsubstituted linear chain saturated radical, but the present application is not limited thereto. For example, an alkyl group having 1 to 20 carbon atoms used in the present application may be a substituted or unsubstituted, linear or branched chain saturated hydrocarbon radical, but the present application is not limited thereto.

When the alkyl group is substituted, the substituent may be one or more substituents selected from the following, but the present application is not limited thereto. It may include a substituted or unsubstituted alkyl group having 1 to 20 carbon atoms, a substituted or unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfonic group (i.e., thiol, —SH), an alkylthio group having 1 to 10 carbon atoms, an arylthio group, a sulfonyl group, a phosphoric acid group, a phosphate ester group, a phosphonic acid group, and a phosphonate ester group, but the present application is not limited thereto. For example, the substituted alkyl group may include a halogenalkyl group, a hydroxyalkyl group, an aminoalkyl group, an alkoxyalkyl group, or an alkaryl group, but the present application is not limited thereto. The alkaryl group belongs to a substituted alkyl group having 1 to 20 carbon atoms, and refers to a case in which at least one hydrogen atom is substituted with an aryl group. For example, the aryl group substituting at least one hydrogen atom may include a benzyl group (phenylmethyl, $PhCH_2—$), a benzhydryl group ($Ph_2CH—$), a trityl group (triphenylmethyl, $Ph_3C—$), a phenylethyl group ($PhCH_2CH_2—$), a styryl group ($PhCH=CH—$), or a cinnamyl group ($PhCH=CHCH_2—$), but the present application is not limited thereto.

For example, $R^1$ to $R^9$ may each independently be an alkyl group, such an alkyl group represents a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms, and when the alkyl group is substituted with an alkyl group, it is also used interchangeably as a "branched alkyl group". A substituent that may be substituted for the alkyl group may include at least one selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxycarbonyl (—C(O)—O—R), alkylcarbonyloxy (—O—C(O)—R), amino (—$NH_2$), carbamoyl (—C(O)—NHR), urea (—NH—C(O)—NHR—), and thiol (—SH), but the present application is not limited thereto. In addition, the alkyl group having 2 or more carbon atoms among the above-described alkyl groups may include at least one carbon-to-carbon double bond or at least one carbon-to-carbon triple bond, but the present application is not limited thereto. For example, it may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanol, or all possible isomers thereof, but the present application is not limited thereto. For example, $R^1$ to $R^4$ and $R^5$ may each be, or alkyl groups that may be substituted therefor may each independently be an alkyl group having 1 to 10 carbon atoms, that is, a methyl group, an ethyl group, a propyl group, a butyl group, a pentyl group, a hexyl group, a heptyl group, an octyl group, a nonyl group, or a decyl group, or an alkyl group having 1 to 6 carbon atoms, that is, a methyl group, an ethyl group, a propyl group, a butyl group, a pentyl group, or a hexyl group, or an alkyl group having 1 to 4 carbon atoms, that is, a methyl group, an ethyl group, an i-propyl group, an n-propyl group, a t-butyl group, an s-butyl group, or an n-butyl group, but the present application is not limited thereto.

For example, when the alkyl group is substituted, the number of substituents substituting the alkyl group may be 1, 2, or 3, but the present application is not limited thereto. The aryl group among the substituents described independently for each of $R^1$ to $R^9$ is a substituted or unsubstituted single-ring or double-ring aromatic group, and this group may contain 6 to 14 carbon atoms, preferably 6 to 10 carbon atoms in the aromatic ring portion. For example, the aryl group used in the present application may include a phenyl group, a naphthyl group, an indenyl group, and an indanyl group, but the present application is not limited thereto. The aryl group may be substituted or unsubstituted, and when the aryl group as defined above is substituted, the substituent may be one or more substituents selected from the following, but the present application is not limited thereto. It may include an unsubstituted alkyl group having 1 to 6 carbon atoms (forming an aralkyl group), an unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphoric acid group, a phosphate ester group, a phosphonic acid group, and a sulfonyl group, but the present application is not limited thereto. For example, the substituted aryl group may have 1, 2, or 3 substituents, but the present application is not limited thereto. For example, the substituted aryl group may be substituted at two positions together with a single alkylene group having 1 to 6 carbon atoms or together with two ligand groups represented by Chemical Formula [—X—($C_1$-$C_6$)alkylene] or Chemical Formula [—X—($C_1$-$C_6$)alkylene-X—], in which X may be selected from O, S, and NR, and R may be H, an aryl group, or an alkyl group having 1 to 6 carbon atoms. For example, the substituted aryl group may be an aryl group fused with a cycloalkyl group or a heterocycloalkyl group. For example, the cyclic atoms of an aryl group may include one or more heteroatoms as a heteroaryl group. Such an aryl group or heteroaryl group is a substituted or unsubstituted single or double bicyclic heterocyclic aromatic group, in which the aromatic group may contain 6 to 10 atoms in a cyclic portion containing one or more heteroatoms. For example, as a 5- or 6-parted ring, it may contain at least one heteroatom selected from O, S, N, P, Se, and Si. For example, 1, 2, or 3 heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but the present application is limited thereto. For example, the heteroaryl group may be unsubstituted, may be substituted as previously described for the aryl group, and when substituted, the number of the substituents may be, for example, 1, 2, or 3, but the present application is not limited thereto.

In an embodiment of the present application, R in Chemical Formula 3 above may include an alkali metal cation in addition to the organic cation, a mixed cation of the organic cation and the alkali metal cation, but the present application is not limited thereto. In this case, the alkali metal cation among the total cations of R in Chemical Formula 3 above may have a molar ratio of more than 0 to 0.2, but the present application is not limited thereto. The alkali metal cation may include a cation of a metal selected from the group consisting of Cs, K, Rb, Mg, Ca, Sr, Ba, and combinations thereof, but the present application is not limited thereto.

In an embodiment of the present application, X in Chemical Formula 3 above may include a halide anion, but the present application is not limited thereto. For example, X in Chemical Formula 3 above is a monovalent halide anion, and may include one or more anions selected from the group consisting of $F^-$, $Cl^-$, $Br^-$, $I^-$, and combinations thereof, but the present application is not limited thereto.

According to an embodiment of the present application, the polymer protective layer 300 may include an ion conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly[2-methoxy ethyl glycidyl ether], and combinations thereof, but the present application is not limited thereto.

Furthermore, the second aspect of the present application provides a method for manufacturing a resistance random access memory device, the method including the operations of: forming a first electrode 100 on a substrate; forming a resistance change layer 200 containing an organometallic halide having a perovskite grain boundary on the first electrode 100; and forming a second electrode 400 on the resistance change layer 200.

According to an embodiment of the present application, the method may further include a operation of forming a polymer protective layer 300 on the resistance change layer 200, but the present application is not limited thereto.

Figure 2:
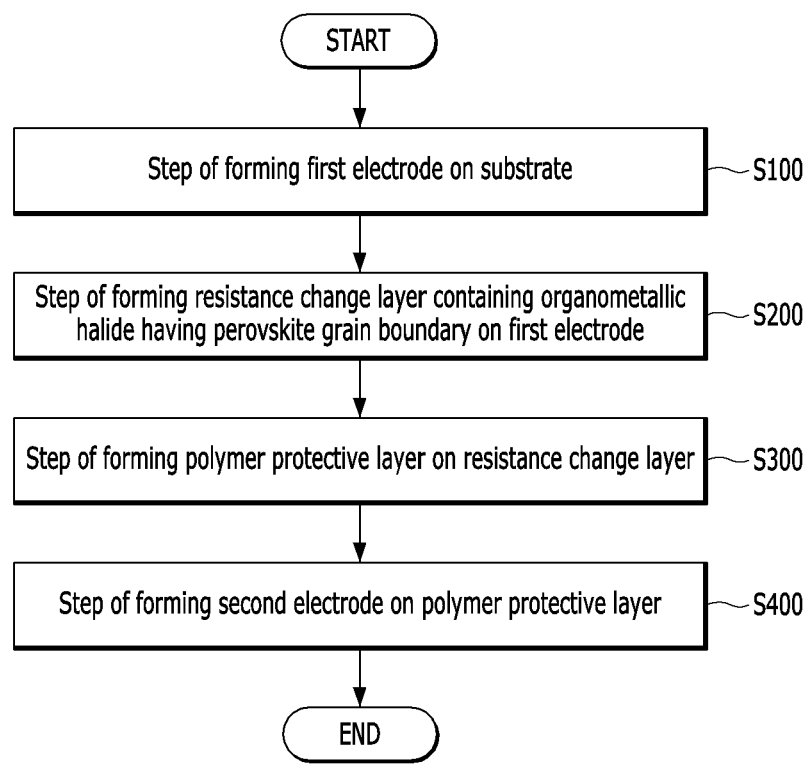
FIG. 2 is a flowchart of a method for manufacturing a resistance random access memory device according to an embodiment of the present application.

Hereinafter, the method for manufacturing the resistance random access memory device will be described with reference to FIG. 2.

First, the first electrode 100 is formed on the substrate (S100).

In an embodiment of the present application, the first electrode 100 may include a material selected from the group consisting of a metal, a conductive polymer, a carbon material, and combinations thereof, but the present application is not limited thereto.

The metal may include a metal selected from the group consisting of Pt, Ti, Cu, Ni, Sc, V, Cr, Mn, Fe, Co, Zn, Y, Zr, Nb, Mo, Tc, Ru, Rh, Pd, Ag, Cd, Hf, Ta, W, Re, Os, Ir, Au, Hg, Rf, Db, Sg, Bh, Hs, Mt, Ds, Rg, Cn, and combinations thereof, but the present application is not limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but the present application is not limited thereto.

The carbon material may include a carbon material selected from the group consisting of carbon nanotubes, graphene, fullerene, carbon nanofibers, and combinations thereof, but the present application is not limited thereto.

Subsequently, the resistance change layer 200 containing an organometallic halide having a perovskite grain boundary is formed on the first electrode 100 (S200).

According to an embodiment of the present application, the operation of forming the resistance change layer 200 may be performed by coating a solution in which a metal alkoxide and an organometallic halide having a perovskite crystal structure are dissolved in a solvent on the first electrode 100, but the present application is not limited thereto.

An amorphous metal oxide may be formed in the perovskite grain boundary by adding the metal alkoxide to the perovskite precursor.

The coating may be performed by one selected from the group consisting of spin coating, bar coating, nozzle printing, spray coating, slot die coating, gravure printing, inkjet printing, screen printing, electrohydrodynamic jet printing, electrospray, and combinations thereof, but the present application is not limited thereto. Preferably, the coating may be performed by spin coating.

Spin coating is a method of thinly coating a solution on a substrate by rotating the substrate at a high speed, and can quickly volatilize the solvent. Further, spin coating has an advantage when coating a solution having a low viscosity According to an embodiment of the present application, the solvent may include one selected from the group consisting of dimethylformamide, dimethylsulfoxide, dimethylacetamide, N-methylpyrrolidone, N-methyl-2-pyridine, pyridine, aniline, and combinations thereof, but the present application is not limited thereto.

According to an embodiment of the present application, the metal alkoxide may include one represented by the following Chemical Formula 4, but the present application is not limited thereto:

  [Chemical Formula 4]

$M\text{-}(OR')_m$ (M is Zr, Ti, Al, Si, Mg, Ca, Sr, Ba, Sc, Y, Hf, V, Nb, Ta, Cr, Mo, W, Mn, Tc, Re, Fe, Ru, Os, Co, Rh, Ir, Ni, C, Zn, Ga, In, Ge, or Sn, m is a valence of M, and R' is hydrogen, or a linear or branched $C_1$-$C_7$ alkyl group). For example, when M is $Zr^{4+}$, m is 4.

According to an embodiment of the present application, the organometallic halide having the perovskite crystal structure may be one represented by the following Chemical Formula 5 or Chemical Formula 6, but the present application is not limited thereto:

  [Chemical Formula 5]

$RMX_3$ (R is a substituted or unsubstituted $C_1$-$C_{24}$ alkyl group, and when R is substituted, the substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion);

  [Chemical Formula 6]

$R_2MX_4$ (R is a substituted or unsubstituted $C_1$-$C_{24}$ alkyl group, and when R is substituted, the substituent is an amino group, a hydroxyl group, a cyano group, a halogen group, a nitro group, or a methoxy group, M includes a metal cation selected from the group consisting of Pb, Sn, Ge, Cu, Ni, Co, Fe, Mn, Cr, Pd, Cd, Yb, and combinations thereof, and X includes a halide anion).

The perovskite grains represented by Chemical Formula 5 above may have a three-dimensional crystal structure, but the present application is not limited thereto.

In an embodiment of the present application, R is a monovalent organic ammonium ion represented by $(R^1R^2R^3R^4N)^+$ in Chemical Formula 5 above, in which $R^1$ to $R^4$ may each independently include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R is a monovalent organic ammonium ion represented by $(R^5\text{—}NH_3)^+$ in Chemical Formula 5 above, in which $R^5$ may include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R may be one represented by Chemical Formula $(R^6R^7N\text{=}CH\text{—}NR^8R^9)^+$ in Chemical Formula 5 above, in which $R^6$ may be hydrogen, an unsubstituted or substituted alkyl group having 1 to 20 carbon atoms, or an unsubstituted or substituted aryl group, $R^7$ may be hydrogen, an unsubstituted or substituted alkyl group having 1 to 20 carbon atoms, or an unsubstituted or substituted aryl group, $R^8$ may be hydrogen, an unsubstituted or substituted alkyl group having 1 to 20 carbon atoms, or an unsubstituted or substituted aryl group, and $R^9$ may be hydrogen, an unsubstituted or substituted alkyl group having 1 to 20 carbon atoms, or an unsubstituted or substituted aryl group, but the present application is not limited thereto.

An alkyl group used in the present application may be a substituted or unsubstituted, linear or branched chain saturated radical, which may often be a substituted or unsubstituted linear chain saturated radical, e.g., an unsubstituted linear chain saturated radical, but the present application is not limited thereto. For example, an alkyl group having 1 to 20 carbon atoms used in the present application may be a substituted or unsubstituted, linear or branched chain saturated hydrocarbon radical, but the present application is not limited thereto.

When the alkyl group is substituted, the substituent may be one or more substituents selected from the following, but the present application is not limited thereto. It may include a substituted or unsubstituted alkyl group having 1 to 20 carbon atoms, a substituted or unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfonic group (i.e., thiol, —SH), an alkylthio group having 1 to 10 carbon atoms, an arylthio group, a sulfonyl group, a phosphoric acid group, a phosphate ester group, a phosphonic acid group, and a phosphonate ester group, but the present application is not limited thereto. For example, the substituted alkyl group may include a halogenalkyl group, a hydroxyalkyl group, an aminoalkyl group, an alkoxyalkyl group, or an alkaryl group, but the present application is not limited thereto. The alkaryl group belongs to a substituted alkyl group having 1 to 20 carbon atoms, and refers to a case in which at least one hydrogen atom is substituted with an aryl group. For example, the aryl group substituting at least one hydrogen atom may include a benzyl group (phenylmethyl, $PhCH_2$—), a benzhydryl group ($Ph_2CH$—), a trityl group (triphenylmethyl, $Ph_3C$—), a phenylethyl group (Ph-$CH_2CH_2$—), a styryl group ($PhCH=CH$—), or a cinnamyl group ($PhCH=CHCH_2$—), but the present application is not limited thereto.

For example, $R^1$ to $R^9$ may each independently be an alkyl group, such an alkyl group represents a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms, and when the alkyl group is substituted with an alkyl group, it is also used interchangeably as a "branched alkyl group". A substituent that may be substituted for the alkyl group may include at least one selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxycarbonyl (—C(O)—O—R), alkylcarbonyloxy (—O—C(O)—R), amino (—$NH_2$), carbamoyl (—C(O)—NHR), urea (—NH—C(O)—NHR—), and thiol (—SH), but the present application is not limited thereto. In addition, the alkyl group having 2 or more carbon atoms among the above-described alkyl groups may include at least one carbon-to-carbon double bond or at least one carbon-to-carbon triple bond, but the present application is not limited thereto. For example, it may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanol, or all possible isomers thereof, but the present application is not limited thereto. For example, $R^1$ to $R^4$ and $R^5$ may each be, or alkyl groups that may be substituted therefor may each independently be an alkyl group having 1 to 10 carbon atoms, that is, a methyl group, an ethyl group, a propyl group, a butyl group, a pentyl group, a hexyl group, a heptyl group, an octyl group, a nonyl group, or a decyl group, or an alkyl group having 1 to 6 carbon atoms, that is, a methyl group, an ethyl group, a propyl group, a butyl group, a pentyl group, or a hexyl group, or an alkyl group having 1 to 4 carbon atoms, that is, a methyl group, an ethyl group, an i-propyl group, an n-propyl group, a t-butyl group, an s-butyl group, or an n-butyl group, but the present application is not limited thereto.

For example, when the alkyl group is substituted, the number of substituents substituting the alkyl group may be 1, 2, or 3, but the present application is not limited thereto. The aryl group among the substituents described independently for each of $R^1$ to $R^9$ is a substituted or unsubstituted single-ring or double-ring aromatic group, and this group may contain 6 to 14 carbon atoms, preferably 6 to 10 carbon atoms in the aromatic ring portion. For example, the aryl group used in the present application may include a phenyl group, a naphthyl group, an indenyl group, and an indanyl group, but the present application is not limited thereto. The aryl group may be substituted or unsubstituted, and when the aryl group as defined above is substituted, the substituent may be one or more substituents selected from the following, but the present application is not limited thereto. It may include an unsubstituted alkyl group having 1 to 6 carbon atoms (forming an aralkyl group), an unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphoric acid group, a phosphate ester group, a phosphonic acid group, and a sulfonyl group, but the present application is not limited thereto. For example, the substituted aryl group may have 1, 2, or 3 substituents, but the present application is not limited thereto. For example, the substituted aryl group may be substituted at two positions together with a single alkylene group having 1 to 6 carbon atoms or together with two ligand groups represented by Chemical Formula [—X—($C_1$-$C_6$)alkylene] or Chemical Formula [—X—($C_1$-$C_6$)alkylene-X—], in which X may be selected from O, S, and NR, and R may be H, an aryl group, or an alkyl group having 1 to 6 carbon atoms. For example, the substituted aryl group may be an aryl group fused with a cycloalkyl group or a heterocycloalkyl group. For example, the cyclic atoms of an aryl group may include one or more heteroatoms as a heteroaryl group. Such an aryl group or heteroaryl group is a substituted or unsubstituted single or double heterocyclic aromatic group, in which the aromatic group may contain 6 to 10 atoms in a cyclic portion containing one or more heteroatoms. For example, as a 5- or 6-parted ring, it may contain at least one heteroatom selected from O, S, N, P, Se, and Si. For example, 1, 2, or 3 heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but the present application is limited thereto. For example, the heteroaryl group may be unsubstituted, may be substituted as previously described for the aryl group, and when substituted, the number of the substituents may be, for example, 1, 2, or 3, but the present application is not limited thereto.

In an embodiment of the present application, R in Chemical Formula 5 above may include an alkali metal cation in addition to the organic cation, a mixed cation of the organic cation and the alkali metal cation, but the present application is not limited thereto. In this case, the alkali metal cation among the total cations of R in Chemical Formula 5 above may have a molar ratio of more than 0 to 0.2, but the present application is not limited thereto. The alkali metal cation may include a cation of a metal selected from the group consisting of Cs, K, Rb, Mg, Ca, Sr, Ba, and combinations thereof, but the present application is not limited thereto.

In an embodiment of the present application, X in Chemical Formula 5 above may include a halide anion, but the present application is not limited thereto. For example, X in Chemical Formula 5 above is a monovalent halide anion, and may include one or more anions selected from the group consisting of $F^-$, $Cl^-$, $Br^-$, $I^-$, and combinations thereof, but the present application is not limited thereto.

In an embodiment of the present application, the organometallic halide of Chemical Formula 5 above may be one or more selected from $CH_3NH_3PbI_xCl_y$ (a real number of $0 \leq x \leq 3$, a real number of $0 \leq y \leq 3$, and $x+y=3$), $CH_3NH_3PbI_xBr_y$ (a real number of $0 \leq x \leq 3$, a real number of $0 \leq y \leq 3$, and $x+y=3$), $CH_3NH_3PbCl_xBr_y$ (a real number of $0 \leq x \leq 3$, a real number of $0 \leq y \leq 3$, and $x+y=3$), and $CH_3NH_3PbI_xF_y$ (a real number of $0 \leq x \leq 3$, a real number of $0 \leq y \leq 3$, and $x+y=3$), and may further be one or more selected from $(CH_3NH_3)_2PbI_xCl_y$ (a real number of $0 \leq x \leq 4$, a real number of $0 \leq y \leq 4$, and $x+y=4$), $(CH_3NH_3)_2PbI_xBr_y$ (a real number of $0 \leq x \leq 4$, a real number of $0 \leq y \leq 4$, and $x+y=4$), $(CH_3NH_3)_2PbCl_xBr_y$ (a real number of $0 \leq x \leq 4$, a real number of $0 \leq y \leq 4$, and $x+y=4$), and $(CH_3NH_3)_2PbI_xF_y$ (a real number of $0 \leq x \leq 4$, a real number of $0 \leq y \leq 4$, and $x+y=4$), but the present application is not limited thereto.

In an embodiment of the present application, the organometallic halide of Chemical Formula 5 above may be one or more selected from $CH_3NH_3PbI_3$ (hereinafter also referred to as $MAPbI_3$), $CH_3NH_3PbBr_3$ (hereinafter also referred to as $MAPbBr_3$), $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$, but the present application is not limited thereto.

For example, the organometallic halide of Chemical Formula 5 above may be one or more selected from $CH_3CH_2NH_3PbI_3$, $CH_3CH_2NH_3PbBr_3$, $CH_3CH_2NH_3PbCl_3$, $CH_3CH_2NH_3PbF_3$, $CH_3CH_2NH_3PbBrI_2$, $CH_3CH_2NH_3PbBrCl_2$, $CH_3CH_2NH_3PbIBr_2$, $CH_3CH_2NH_3PbICl_2$, $CH_3CH_2NH_3PbClBr_2$, $CH_3CH_2NH_3PbI_2Cl$, $CH_3CH_2NH_3SnBrI_2$, $CH_3CH_2NH_3SnBrCl_2$, $CH_3CH_2NH_3SnF_2Br$, $CH_3CH_2NH_3SnIBr_2$, $CH_3CH_2NH_3SnICl_2$, $CH_3CH_2NH_3SnF_2I$, $CH_3CH_2NH_3SnClBr_2$, $CH_3CH_2NH_3SnI_2Cl$, and $CH_3NH_3SnF_2Cl$, but the present application is not limited thereto.

For example, the organometallic halide of Chemical Formula 5 above may be one or more selected from $CH_3(CH_2)_2NH_3PbI_3$, $CH_3(CH_2)_2NH_3PbBr_3$, $CH_3(CH_2)_2NH_3PbCl_3$, $CH_3(CH_2)_2NH_3PbF_3$, $CH_3(CH_2)_2NH_3PbBrI_2$, $CH_3(CH_2)_2NH_3PbBrCl_2$, $CH_3(CH_2)_2NH_3PbIBr_2$, $CH_3(CH_2)_2NH_3PbICl_2$, $CH_3(CH_2)_2NH_3PbClBr_2$, $CH_3(CH_2)_2NH_3PbI_2Cl$, $CH_3(CH_2)_2NH_3SnF_2Br$, $CH_3(CH_2)_2NH_3SnICl_2$, $CH_3(CH_2)_2NH_3SnF_2I$, $CH_3(CH_2)_2NH_3SnI_2Cl$, and $CH_3(CH_2)_2NH_3SnF_2Cl$, but the present application is not limited thereto.

For example, the organometallic halide of Chemical Formula 5 above may be one or more selected from $CH_3(CH_2)_3NH_3PbI_3$, $CH_3(CH_2)_3NH_3PbBr_3$, $CH_3(CH_2)_3NH_3PbCl_3$, $CH_3(CH_2)_3NH_3PbF_3$, $CH_3(CH_2)_3PbBrI_2$, $CH_3(CH_2)_3NH_3PbBrCl_2$, $CH_3(CH_2)_3NH_3PbIBr_2$, $CH_3(CH_2)_3NH_3PbICl_2$, $CH_3(CH_2)_3NH_3PbClBr_2$, $CH_3(CH_2)_3NH_3PbI_2Cl$, $CH_3(CH_2)_3NH_3SnF_2Br$, $CH_3(CH_2)_3NH_3SnF_2I$, and $CH_3(CH_2)_3NH_3SnF$—Cl, but the present application is not limited thereto.

For example, an organometallic halide having a three-dimensional perovskite crystal structure according to an embodiment of the present application may include $CH_3NH_3PbI_3$.

The perovskite grains represented by Chemical Formula 6 above may have a two-dimensional crystal structure, but the present application is not limited thereto.

In an embodiment of the present application, R is a monovalent organic ammonium ion represented by $(R^1R^2R^3R^4N)^+$ in Chemical Formula 6 above, in which $R^1$ to $R^4$ may each independently include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R is a monovalent organic ammonium ion represented by $(R^5—NH_3)^+$ in Chemical Formula 6 above, in which $R^5$ may include one selected from the group consisting of a linear or branched alkyl group having 1 to 24 carbon atoms, a cycloalkyl group having 3 to 20 carbon atoms, an aryl group having 6 to 20 carbon atoms, and combinations thereof, but the present application is not limited thereto.

In an embodiment of the present application, R may be represented by Chemical Formula $(R^6R^7N=CH—NR^8R^9)^+$ in Chemical Formula 6 above, in which $R^6$ may be hydrogen, an unsubstituted or substituted alkyl group having 1 to 20 carbon atoms, or an unsubstituted or substituted aryl group, $R^7$ may be hydrogen, an unsubstituted or substituted alkyl group having 1 to 20 carbon atoms, or an unsubstituted or substituted aryl group, $R^8$ may be hydrogen, an unsubstituted or substituted alkyl group having 1 to 20 carbon atoms, or an unsubstituted or substituted aryl group, and $R^9$ may be hydrogen, an unsubstituted or substituted alkyl group having 1 to 20 carbon atoms, or an unsubstituted or substituted aryl group, but the present application is not limited thereto.

An alkyl group used in the present application may be a substituted or unsubstituted, linear or branched chain saturated radical, which may often be a substituted or unsubstituted linear chain saturated radical, e.g., an unsubstituted linear chain saturated radical, but the present application is not limited thereto. For example, an alkyl group having 1 to 20 carbon atoms used in the present application may be a substituted or unsubstituted, linear or branched chain saturated hydrocarbon radical, but the present application is not limited thereto.

When the alkyl group is substituted, the substituent may be one or more substituents selected from the following, but the present application is not limited thereto. It may include a substituted or unsubstituted alkyl group having 1 to 20 carbon atoms, a substituted or unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfonic group (i.e., thiol, —SH), an alkylthio group having 1 to 10 carbon atoms, an arylthio group, a sulfonyl group, a phosphoric acid group, a phosphate ester group, a phosphonic acid group, and a phosphonate ester group, but the present application is not limited thereto. For example, the substituted alkyl group may include a halogenalkyl group, a hydroxyalkyl group, an aminoalkyl group, an alkoxyalkyl group, or an alkaryl group, but the present application is not limited thereto. The alkaryl group belongs to a substituted alkyl group having 1 to 20 carbon atoms, and refers to a case in which at least one hydrogen atom is substituted with an aryl group. For example, the aryl group substituting at least one hydrogen atom may include a benzyl group (phenylmethyl, PhCH$_2$—), a benzhydryl group (Ph$_2$CH—), a trityl group (triphenylmethyl, Ph$_3$C—), a phenylethyl group (Ph-CH$_2$CH$_2$—), a styryl group (PhCH═CH—), or a cinnamyl group (PhCH═CHCH$_2$—), but the present application is not limited thereto.

For example, R$^1$ to R$^9$ may each independently be an alkyl group, such an alkyl group represents a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms, and when the alkyl group is substituted with an alkyl group, it is also used interchangeably as a "branched alkyl group". A substituent that may be substituted for the alkyl group may include at least one selected from the group consisting of halo (e.g., F, Cl, Br, I), haloalkyl (e.g., CCl$_3$ or CF$_3$), alkoxy, alkylthio, hydroxy, carboxy (—C(O)—OH), alkyloxycarbonyl (—C(O)—O—R), alkylcarbonyloxy (—O—C(O)—R), amino (—NH$_2$), carbamoyl (—C(O)—NHR), urea (—NH—C(O)—NHR—), and thiol (—SH), but the present application is not limited thereto. In addition, the alkyl group having 2 or more carbon atoms among the above-described alkyl groups may include at least one carbon-to-carbon double bond or at least one carbon-to-carbon triple bond, but the present application is not limited thereto. For example, it may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanol, or all possible isomers thereof, but the present application is not limited thereto. For example, R$^1$ to R$^4$ and R$^5$ may each be, or alkyl groups that may be substituted therefor may each independently be an alkyl group having 1 to 10 carbon atoms, that is, a methyl group, an ethyl group, a propyl group, a butyl group, a pentyl group, a hexyl group, a heptyl group, an octyl group, a nonyl group, or a decyl group, or an alkyl group having 1 to 6 carbon atoms, that is, a methyl group, an ethyl group, a propyl group, a butyl group, a pentyl group, or a hexyl group, or an alkyl group having 1 to 4 carbon atoms, that is, a methyl group, an ethyl group, an i-propyl group, an n-propyl group, a t-butyl group, an s-butyl group, or an n-butyl group, but the present application is not limited thereto.

For example, when the alkyl group is substituted, the number of substituents substituting the alkyl group may be 1, 2, or 3, but the present application is not limited thereto. The aryl group among the substituents described independently for each of R$^1$ to R$^9$ is a substituted or unsubstituted single-ring or double-ring aromatic group, and this group may contain 6 to 14 carbon atoms, preferably 6 to 10 carbon atoms in the aromatic ring portion. For example, the aryl group used in the present application may include a phenyl group, a naphthyl group, an indenyl group, and an indanyl group, but the present application is not limited thereto. The aryl group may be substituted or unsubstituted, and when the aryl group as defined above is substituted, the substituent may be one or more substituents selected from the following, but the present application is not limited thereto. It may include an unsubstituted alkyl group having 1 to 6 carbon atoms (forming an aralkyl group), an unsubstituted aryl group, a cyano group, an amino group, an alkylamino group having 1 to 10 carbon atoms, a dialkylamino group having 1 to 10 carbon atoms, an arylamino group, a diarylamino group, an arylalkylamino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphoric acid group, a phosphate ester group, a phosphonic acid group, and a sulfonyl group, but the present application is not limited thereto. For example, the substituted aryl group may have 1, 2, or 3 substituents, but the present application is not limited thereto. For example, the substituted aryl group may be substituted at two positions together with a single alkylene group having 1 to 6 carbon atoms or together with two ligand groups represented by Chemical Formula [—X—(C$_1$-C$_6$)alkylene] or Chemical Formula [—X—(C$_1$-C$_6$)alkylene-X—], in which X may be selected from O, S, and NR, and R may be H, an aryl group, or an alkyl group having 1 to 6 carbon atoms. For example, the substituted aryl group may be an aryl group fused with a cycloalkyl group or a heterocycloalkyl group. For example, the cyclic atoms of an aryl group may include one or more heteroatoms as a heteroaryl group. Such an aryl group or heteroaryl group is a substituted or unsubstituted single or double heterocyclic aromatic group, in which the aromatic group may contain 6 to 10 atoms in a cyclic portion containing one or more heteroatoms. For example, as a 5- or 6-parted ring, it may contain at least one heteroatom selected from O, S, N, P, Se, and Si. For example, 1, 2, or 3 heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but the present application is limited thereto. For example, the heteroaryl group may be unsubstituted, may be substituted as previously described for the aryl group, and when substituted, the number of the substituents may be, for example, 1, 2, or 3, but the present application is not limited thereto.

In an embodiment of the present application, R in Chemical Formula 6 above may include an alkali metal cation in addition to the organic cation, a mixed cation of the organic cation and the alkali metal cation, but the present application is not limited thereto. In this case, the alkali metal cation among the total cations of R in Chemical Formula 6 above may have a molar ratio of more than 0 to 0.2, but the present application is not limited thereto. The alkali metal cation may include a cation of a metal selected from the group consisting of Cs, K, Rb, Mg, Ca, Sr, Ba, and combinations thereof, but the present application is not limited thereto.

In an embodiment of the present application, X in Chemical Formula 6 above may include a halide anion, but the present application is not limited thereto. For example, X in Chemical Formula 6 above is a monovalent halide anion, and may include one or more anions selected from the group consisting of F$^-$, Cl$^-$, Br$^-$, I$^-$, and combinations thereof, but the present application is not limited thereto.

Subsequently, a polymer protective layer 300 is formed on the resistance change layer 200 (S300).

In the method of forming the polymer protective layer 300, it may be formed by spin-coating an ion conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly[2-methoxy ethyl glycidyl ether], and combinations thereof on the resistance change layer 200, but the present application is not limited thereto. Preferably, it may be formed by spin-coating polymethyl methacrylate on the resistance change layer 200.

Subsequently, a second electrode 400 is formed on the polymer protective layer 300 (S400).

In an embodiment of the present application, the second electrode 400 may include a material selected from the group consisting of a metal, a conductive polymer, a carbon material, and combinations thereof, but the present application is not limited thereto.

The metal may include a metal selected from the group consisting of Pt, Ti, Ag, Cu, Ni, Sc, V, Cr, Mn, Fe, Co, Zn, Y, Zr, Nb, Mo, Tc, Ru, Rh, Pd, Cd, Hf, Ta, W, Re, Os, Ir, Au, Hg, Rf, Db, Sg, Bh, Hs, Mt, Ds, Rg, Cn, and combinations thereof, but the present application is not limited thereto.

The conductive polymer may include a material selected from the group consisting of poly(3,4-ethylenedioxythiophene), poly(3,4-ethylenedioxythiophene) polystyrene sulfonate, polyacetylene, polypyrrole, polythiophene, polyaniline, polyphenylene, polyphenylene sulfide, polyfullerene, and combinations thereof, but the present application is not limited thereto.

The carbon material may include a carbon material selected from the group consisting of carbon nanotubes, graphene, fullerene, carbon nanofibers, and combinations thereof, but the present application is not limited thereto.

With respect to the method for manufacturing the resistance random access memory device according to the second aspect of the present application, detailed descriptions of parts overlapping with the first aspect of the present application have been omitted, but even if the descriptions have been omitted, the contents described in the first aspect of the present application may be equally applied to the second aspect of the present application.

Furthermore, the third aspect of the present application provides a memristor including the resistance random access memory device according to the first aspect.

A memristor (memory+resistor) is a compound word of a memory resistor or a resistive memory, and is being applied to next-generation memory devices, circuits, etc.

A memristor remembers and stores a series of events even in a state that the current is off. Therefore, the memristor enables the construction of new logic circuits such as a terabit memory, a fault recognition device by a neural network circuit configuration, etc. As such, a memristor, a new concept device, has been studied a lot recently due to its high potential.

On the other hand, as an example, an existing dynamic random access memory (DRAM) is an aggregation of devices consisting of one transistor and capacitors, and each capacitor represents "1" and "0" of a bit according to the number of electrons it contains, but eventually the remembered information is lost since the capacitor leaks electrons. As such, not only current memory technologies, including existing dynamic random access memory (DRAM), static RAM (SRAM), and NAND flash, are rapidly reaching their scalability limits, but also the need for memristors is becoming more prominent due to a problem that information is lost.

With respect to the memristor according to the third aspect of the present application, detailed descriptions of parts overlapping with the first aspect of the present application have been omitted, but even if the descriptions have been omitted, the contents described in the first aspect of the present application may be equally applied to the third aspect of the present application.

Although the present disclosure will be described in more detail through the following Examples, the following Examples are for illustrative purposes only and are not intended to limit the scope of the present application.

Example 1: Manufacturing of Resistance Random Access Memory Device

First, a hydrophilic group was formed on the surface through UV ozone treatment on a silicon substrate on which a Pt/Ti electrode was deposited. After additionally adding 0.15 mM of zirconium ethoxide, titanium ethoxide, silica ethoxide, or aluminum propoxide to a mixed solution in which $CH_3NH_3I$ and $PbI_2$ were dissolved in a dimethylformamide and dimethylsulfoxide solution at a molar ratio of 1:1 and in an amount of 55% by weight, spin coating was performed on the substrate to form a resistance change layer.

Then, a solution in which polymethyl methacrylate was dissolved in 2 mg/ml of chlorobenzene was subjected to spin coating on the resistance change layer to form a polymer protective layer.

A second electrode was formed by depositing silver to a thickness of 50 nm or more on the polymer protective layer under the condition of $10^{-6}$ torr.

Experimental Example 1

FIG. 3 is graphs measuring the relationship between voltage and current depending on the types of amorphous metal compounds of the resistance random access memory devices manufactured according to an example and a comparative example of the present application.

(A) of FIG. 3 is a graph measuring the relationship between voltage and current of the resistance random access memory device manufactured according to a comparative example of the present application, and (B), (C), (D), and (E) of FIG. 3 are graphs measuring the relationship between voltage and current depending on the types of the amorphous metal oxide of the resistance random access memory device manufactured according to an example of the present application.

Referring to FIG. 3, it could be seen that there was no significant change in the driving voltage depending on the material of an amorphous metal oxide formed in the perovskite grain boundary, but the amorphous metal oxide had a significant influence on the formation of a filament due to an increase in the forming voltage.

Experimental Example 2

(A) of FIG. 4 is a graph measuring the durability of the resistance random access memory device manufactured according to a comparative example of the present application, and (B), (C), (D), and (E) of FIG. 4 are graphs measuring the durability depending on the types of the amorphous metal oxide of the resistance random access memory device manufactured according to an example of the present application.

Referring to FIG. 4, it could be confirmed that the durability was the lowest at 1,400 cycles in the case of FIG. 4A in which the amorphous metal oxide was not contained in the perovskite grain boundary.

It could be confirmed that (A) of FIG. 4 had a high durability compared to (B), (C), (D), and (E) of FIG. 4 in which the amorphous metal oxide was contained in the perovskite grain boundary.

Further, it was possible to confirm a difference in the durability depending on the types of the amorphous metal oxide. When $ZrO_x$ and $TiO_x$ were amorphous metal oxides, it could be confirmed that they had the highest durability of 10,000 cycles or more, and it could be confirmed that $AlO_x$ had 6,200 cycles, and $SiO_x$ had 5,500 cycles.

Experimental Example 3

FIG. 5 depicts photographs showing changes in the solvent due to the hydrolysis reaction of the perovskite grain precursor depending on the concentrations of the metal alkoxides according to an example and a comparative example of the present application.

Referring to FIG. 5, as the concentration of the metal alkoxide added during the manufacturing process increased, the reaction with water increased to produce a large amount of metal hydrate. Accordingly, the metal alkoxide and the metal hydrate reacted and/or the metal hydrates reacted with each other.

In the above reaction, water and alcohol were produced. Since this reaction occured in a continuous cycle, the higher the metal alkoxide concentration added, the more the hydrolysis. As a result, it brought a precipitation problem of water and alcohol.

Through this, it could be found that when the concentration of the metal alkoxide is increased to a certain level or more, the film quality may be deteriorated during the perovskite formation to result in deterioration of properties.

Experimental Example 4

FIG. 6 depicts graphs measuring the durability depending on the concentrations of the metal alkoxides of the resistance random access memory devices manufactured according to an example and a comparative example of the present application.

(A) of FIG. 6 is a graph measuring the durability of the resistance random access memory device manufactured according to a comparative example of the present application, and (B), (C), and (D) of FIG. 6 are graphs measuring the durability of the resistance random access memory devices manufactured by adding 0.15 mM, 0.3 mM, and 0.6 mM of zirconium ethoxide respectively according to an example of the present application.

Referring to FIG. 6, it was confirmed that the case of (A) of FIG. 6 in which the amorphous metal oxide was not contained in the perovskite grain boundary showed the lowest durability, and the case of (D) of FIG. 6 in which the most zirconium ethoxide was added had the highest durability.

Further, the case of (C) of FIG. 6 in which 0.3 mM of zirconium ethoxide was added exhibited durability of 3,800 cycles, and the case of (B) of FIG. 6 in which 0.15 mM of zirconium ethoxide was added exhibited durability of 2,200 cycles.

Through this, it could be confirmed that the durability increases as the amount of the metal alkoxide added increases during the manufacturing process of the resistance random access memory device.

Experimental Example 5

FIG. 7 is a table showing the cohesive energies of a perovskite crystal structure and oxides according to an example and a comparative example of the present application.

Referring to FIG. 7, it could be confirmed that the metal oxides had high cohesive energies compared to the perovskite material by comparing cohesive energies of the perovskite crystal structure and metal oxides.

Through this, it could be seen that even if another metal alkoxide not used in the experiment is added and passivation of the perovskite grains is executed, the movement of halide ions and metal ions of the perovskite grains may be prevented.

Experimental Example 6

(A) of FIG. 8 is an actual image of a perovskite material in which an amorphous metal oxide is not contained in the perovskite grain boundary fabricated according to a comparative example of the present application, and (B) of FIG. 8 is electron energy loss spectroscopy (EELS) data of the perovskite material (A) of FIG. 9 is an actual image of a perovskite material in which $SiO_x$ is formed as an amorphous metal oxide in the perovskite grain boundary fabricated according to an example of the present application, and (B) of FIG. 9 is electron energy loss spectroscopy (EELS) data of the perovskite material.

(A) of FIG. 10 is an actual image of a perovskite material in which $TiO_x$ is formed as an amorphous metal oxide in the perovskite grain boundary fabricated according to an example of the present application, and (B) of FIG. 10 is electron energy loss spectroscopy (EELS) data of the perovskite material.

(A) of FIG. 11 is an actual image of a perovskite material in which $ZrO_x$ is formed as an amorphous metal oxide in the perovskite grain boundary fabricated according to an example of the present application, and (B) of FIG. 11 is electron energy loss spectroscopy (EELS) data of the perovskite material.

(A) of FIG. 12 is an actual image of a perovskite material in which $AlO_x$ is formed as an amorphous metal oxide in the perovskite grain boundary fabricated according to an example of the present application, and (B) of FIG. 12 is electron energy loss spectroscopy (EELS) data of the perovskite material.

Where the amorphous metal oxide is concentrated can be seen by confirming differences between the center of the perovskite grains and oxygen peaks of the perovskite grain boundary through the electron energy loss spectroscopy (EELS) data.

Referring to (A) of FIG. 8, it could be confirmed that an amorphous metal oxide was formed in the perovskite grain boundary so that the grain boundary was not passivated, and it could be seen from FIG. (B) of 8 that the oxygen peaks were not confirmed on the data. Through this, it could be confirmed that the amorphous metal oxide was not formed in the grain boundary of the perovskite.

Referring to each of (A) of FIGS. 9 to 12, it could be confirmed that an amorphous metal oxide was formed in the perovskite grain boundary so that the grain boundary was passivated, and sharp peaks could be confirmed from the perovskite grain boundary in each of (B) of FIGS. 9 to 12.

Through this, it could be confirmed that more oxygen was present in the perovskite grain boundary, and it could be confirmed that the oxygen peaks were found also in the center of the perovskite grains since the grains existed in the thickness direction.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A resistance random access memory device comprising:
    a resistance change layer, comprising an organometallic halide having perovskite grains, disposed on a first electrode; and
    a second electrode disposed on the resistance change layer,
    wherein a boundary between the perovskite grains comprises an amorphous metal oxide, and
    wherein halide ions do not pass between the grains due to a boundary between the grains.

2. The resistance random access memory device of claim 1, wherein the amorphous metal oxide is one represented by Chemical Formula 1:

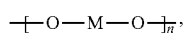, [Chemical Formula 1]

wherein M is Zr, Ti, Al, Si, Mg, Ca, Sr, Ba, Sc, Y, Hf, V, Nb, Ta, Cr, Mo, W, Mn, Tc, Re, Fe, Ru, Os, Co, Rh, Ir, Ni, C, Zn, Ga, In, Ge, or Sn, and
n is 1 to 25.

3. The resistance random access memory device of claim 1, further comprising a polymer protective layer disposed between the second electrode and the resistance change layer.

4. The resistance random access memory device of claim 3, wherein the polymer protective layer comprises an ion conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly[2-methoxy ethyl glycidyl ether], and combinations thereof.

5. The resistance random access memory device of claim 1, wherein the organometallic halide is one represented by Chemical Formula 2 or Chemical Formula 3:

, [Chemical Formula 2]

wherein R is a substituted or unsubstituted $C_1$-$C_{24}$ alkyl group, and when R is substituted, the substituent is an amino group, a hydroxyl group, a cyano group, a halogen group, a nitro group, or a methoxy group,
M comprises a metal cation selected from the group consisting of Pb, Sn, Ge, Cu, Ni, Co, Fe, Mn, Cr, Pd, Cd, Yb, and combinations thereof, and
X comprises a halide anion;

, [Chemical Formula 3]

wherein R is a substituted or unsubstituted $C_1$-$C_{24}$ alkyl group, and when R is substituted, the substituent is an amino group, a hydroxyl group, a cyano group, a halogen group, a nitro group, or a methoxy group,
M comprises a metal cation selected from the group consisting of Pb, Sn, Ge, Cu, Ni, Co, Fe, Mn, Cr, Pd, Cd, Yb, and combinations thereof, and
X comprises a halide anion.

6. The resistance random access memory device of claim 1, wherein each of the first electrode and the second electrode comprises a material selected from the group consisting of a metal, a conductive polymer, a carbon material, and combinations thereof.

7. The resistance random access memory device of claim 1, wherein the first electrode and the second electrode comprise same or different electrode materials.

8. A method for manufacturing a resistance random access memory device, the method comprising:
    forming a first electrode on a substrate;
    forming a resistance change layer, comprising an organometallic halide having a perovskite grain boundary, on the first electrode;
    forming a second electrode on the resistance change layer; and
    forming a polymer protective layer on the resistance change layer before forming the second electrode.

9. The method of claim 8, wherein the forming of the resistance change layer comprises coating a solution in which a metal alkoxide and an organometallic halide having a perovskite crystal structure are dissolved in a solvent on the first electrode.

10. The method of claim 9, wherein the metal alkoxide is one represented Chemical Formula 4:

, [Chemical Formula 4]

wherein M is Zr, Ti, Al, Si, Mg, Ca, Sr, Ba, Sc, Y, Hf, V, Nb, Ta, Cr, Mo, W, Mn, Tc, Re, Fe, Ru, Os, Co, Rh, Ir, Ni, C, Zn, Ga, In, Ge, or Sn,
m is a valence of M, and
R' is hydrogen, or a linear or branched $C_1$-$C_7$ alkyl group.

11. The method of claim 9, wherein the solvent is one selected from the group consisting of dimethylformamide, dimethylsulfoxide, dimethylacetamide, N-methylpyrrolidone, N-methyl-2-pyridine, pyridine, aniline, and combinations thereof.

12. The method of claim 9, wherein the organometallic halide having the perovskite crystal structure is one represented by the following Chemical Formula 5 or Chemical Formula 6:

, [Chemical Formula 5]

wherein R is a substituted or unsubstituted $C_1$-$C_{24}$ alkyl group, and when R is substituted, the substituent is an amino group, a hydroxyl group, a cyano group, a halogen group, a nitro group, or a methoxy group,
M comprises a metal cation selected from the group consisting of Pb, Sn, Ge, Cu, Ni, Co, Fe, Mn, Cr, Pd, Cd, Yb, and combinations thereof, and
X comprises a halide anion;

, [Chemical Formula 6]

wherein R is a substituted or unsubstituted $C_1$-$C_{24}$ alkyl group, and when R is substituted, the substituent is an amino group, a hydroxyl group, a cyano group, a halogen group, a nitro group, or a methoxy group, M comprises a metal cation selected from the group consisting of Pb, Sn, Ge, Cu, Ni, Co, Fe, Mn, Cr, Pd, Cd, Yb, and combinations thereof, and X comprises a halide anion.

13. A memristor comprises the resistance random access memory device of claim 1.

14. A resistance random access memory device comprising:
a resistance change layer, comprising an organometallic halide having perovskite grains, disposed on a first electrode;
a second electrode disposed on the resistance change layer; and
a polymer protective layer disposed between the second electrode and the resistance change layer,
wherein a boundary between the perovskite grains comprises an amorphous metal oxide.

15. The resistance random access memory device of claim 14, wherein the amorphous metal oxide is one represented by Chemical Formula 1:

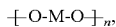      [Chemical Formula 1]

wherein M is Zr, Ti, Al, Si, Mg, Ca, Sr, Ba, Sc, Y, Hf, V, Nb, Ta, Cr, Mo, W, Mn, Tc, Re, Fe, Ru, Os, Co, Rh, Ir, Ni, C, Zn, Ga, In, Ge, or Sn, and n is 1 to 25.

16. The resistance random access memory device of claim 14, wherein the polymer protective layer comprises an ion conductive polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, poly(methoxy polyethylene glycol methacrylate), poly[2-methoxy ethyl glycidyl ether], and combinations thereof.

17. The resistance random access memory device of claim 14, wherein the organometallic halide is one represented by Chemical Formula 2 or Chemical Formula 3:

      [Chemical Formula 2]

wherein R is a substituted or unsubstituted $C_1$-$C_{24}$ alkyl group, and when R is substituted, the substituent is an amino group, a hydroxyl group, a cyano group, a halogen group, a nitro group, or a methoxy group, M comprises a metal cation selected from the group consisting of Pb, Sn, Ge, Cu, Ni, Co, Fe, Mn, Cr, Pd, Cd, Yb, and combinations thereof, and X comprises a halide anion;

      [Chemical Formula 3]

wherein R is a substituted or unsubstituted $C_1$-$C_{24}$ alkyl group, and when R is substituted, the substituent is an amino group, a hydroxyl group, a cyano group, a halogen group, a nitro group, or a methoxy group, M comprises a metal cation selected from the group consisting of Pb, Sn, Ge, Cu, Ni, Co, Fe, Mn, Cr, Pd, Cd, Yb, and combinations thereof, and X comprises a halide anion.

18. The resistance random access memory device of claim 14, wherein each of the first electrode and the second electrode comprises a material selected from the group consisting of a metal, a conductive polymer, a carbon material, and combinations thereof.

19. The resistance random access memory device of claim 14, wherein the first electrode and the second electrode comprise same or different electrode materials.

20. A memristor comprises the resistance random access memory device of claim 14.

* * * * *

UNITED STATES PATENT AND TRADEMARK OFFICE
CERTIFICATE OF CORRECTION

| | | |
|---|---|---|
| PATENT NO. | : 12,201,042 B2 | Page 1 of 1 |
| APPLICATION NO. | : 17/527648 | |
| DATED | : January 14, 2025 | |
| INVENTOR(S) | : Hyun Suk Jung et al. | |

It is certified that error appears in the above-identified patent and that said Letters Patent is hereby corrected as shown below:

On the Title Page

Between items (65) and (51) insert the following item (30):
--(30) Foreign Application Priority Data
Nov. 16, 2020 (KR) ................... 10-2020-0152790--

Signed and Sealed this
Twenty-seventh Day of May, 2025

Coke Morgan Stewart
*Acting Director of the United States Patent and Trademark Office*